(12) United States Patent
Hatakeyama et al.

(10) Patent No.: US 6,671,034 B1
(45) Date of Patent: Dec. 30, 2003

(54) MICROFABRICATION OF PATTERN IMPRINTING

(75) Inventors: Masahiro Hatakeyama, Fujisawa (JP); Katsunori Ichiki, Fujisawa (JP); Tohru Satake, Chigasaki (JP); Yotaro Hatamura, 2-12-11 Kohinata, Bunkyo-ku, Tokyo (JP); Masayuki Nakao, Matsudo (JP)

(73) Assignees: Ebara Corporation, Tokyo (JP); Yotaro Hatamura, Tokyo (JP)

( * ) Notice: Subject to any disclaimer, the term of this patent is extended or adjusted under 35 U.S.C. 154(b) by 0 days.

(21) Appl. No.: 09/301,311

(22) Filed: Apr. 29, 1999

(30) Foreign Application Priority Data

| Apr. 30, 1998 | (JP) | 10/136145 |
| Apr. 30, 1998 | (JP) | 10/136146 |
| Apr. 30, 1998 | (JP) | 10/136149 |
| Apr. 30, 1998 | (JP) | 10/136150 |
| Apr. 30, 1998 | (JP) | 10/136153 |

(51) Int. Cl.$^7$ .............. G03B 27/54; G03B 9/00
(52) U.S. Cl. .............. 355/67; 430/5
(58) Field of Search .............. 355/67, 75, 53; 430/5, 311, 322; 250/492.2

(56) References Cited

U.S. PATENT DOCUMENTS

| 5,928,815 A | * | 7/1999 | Martin | 430/5 |
| 6,171,730 B1 | * | 1/2001 | Kuroda et al. | 430/5 |
| 6,187,482 B1 | * | 2/2001 | Kuroda et al. | 430/5 |

FOREIGN PATENT DOCUMENTS

JP    8-179493    * 7/1996

* cited by examiner

*Primary Examiner*—Alan A. Mathews
(74) *Attorney, Agent, or Firm*—Wenderoth, Lind & Ponack, L.L.P.

(57) ABSTRACT

The object of the present invention IS to provide an optical imprinting apparatus and method for producing a two-dimensional pattern, having line widths less than the wavelength of an exposure light. The evarnescent (proximity) field effect is adopted to realize the apparatus and method. An optical imprinting apparatus comprises: a container in which light is enclosed therein; an exposure-mask having a proximity field exposure pattern firmly fixed to a section of said container for exposing said exposure pattern on a photo-sensitive material through an evanescent field by said light enclosed therein; and a light source for supplying said light in said container.

10 Claims, 35 Drawing Sheets

F I G. 1
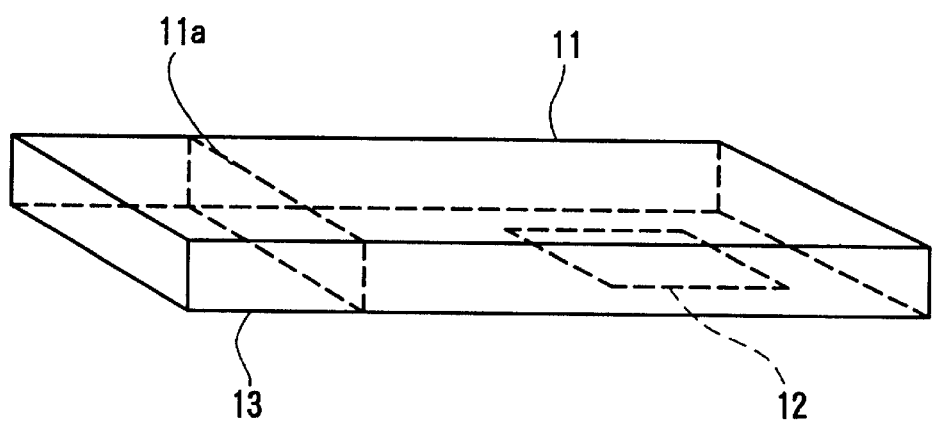

FIG. 28A
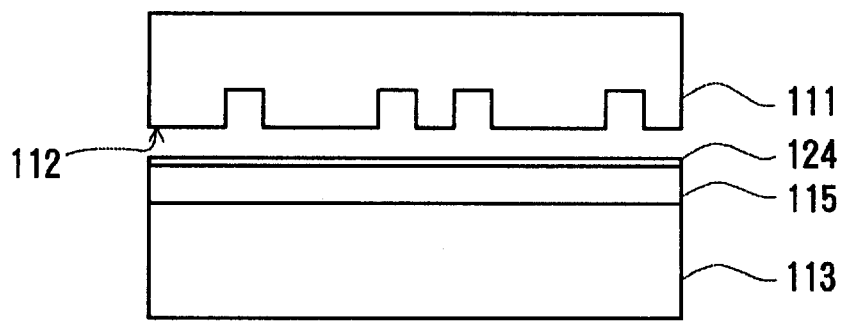
FIG. 28B
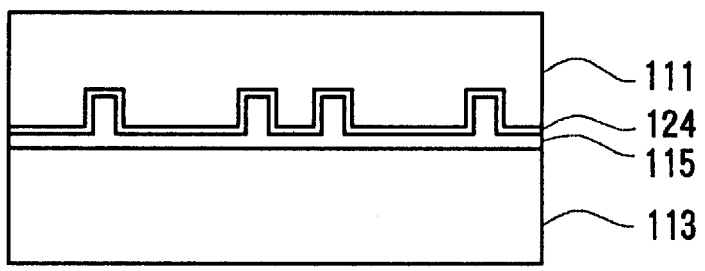
FIG. 28C
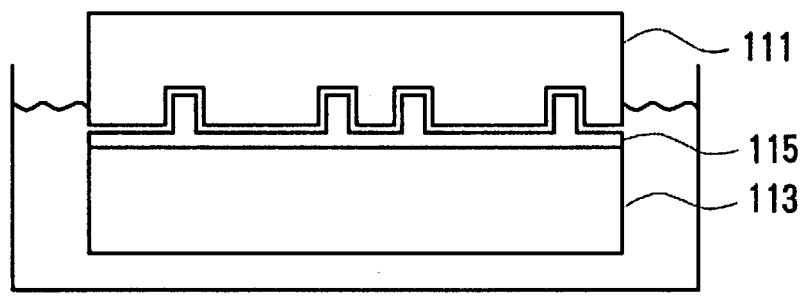
FIG. 28D
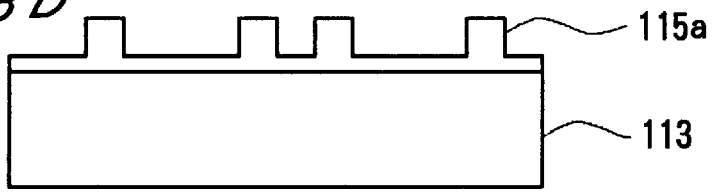
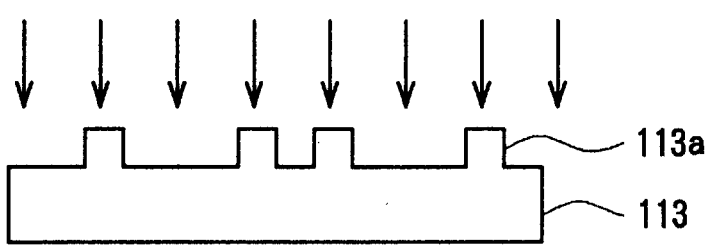
FIG. 28E F I G. 3 3
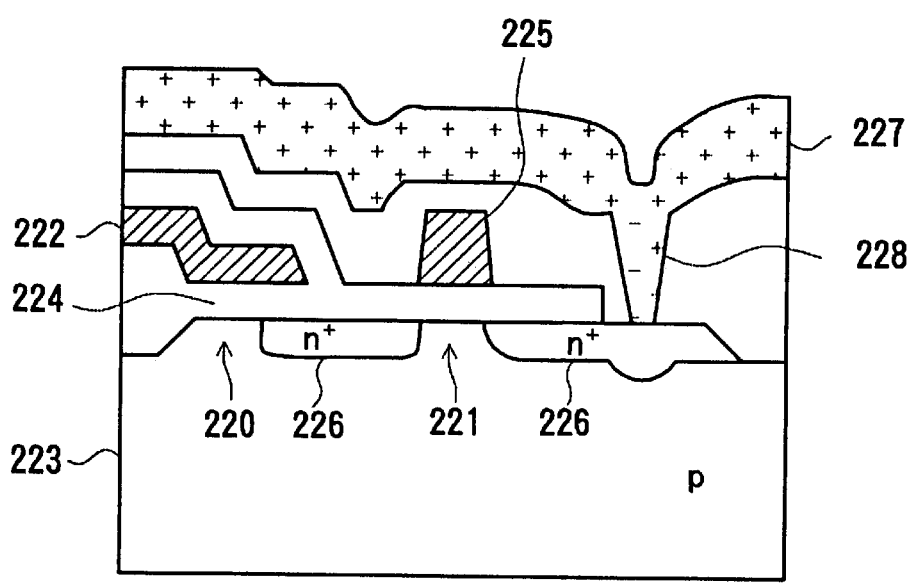

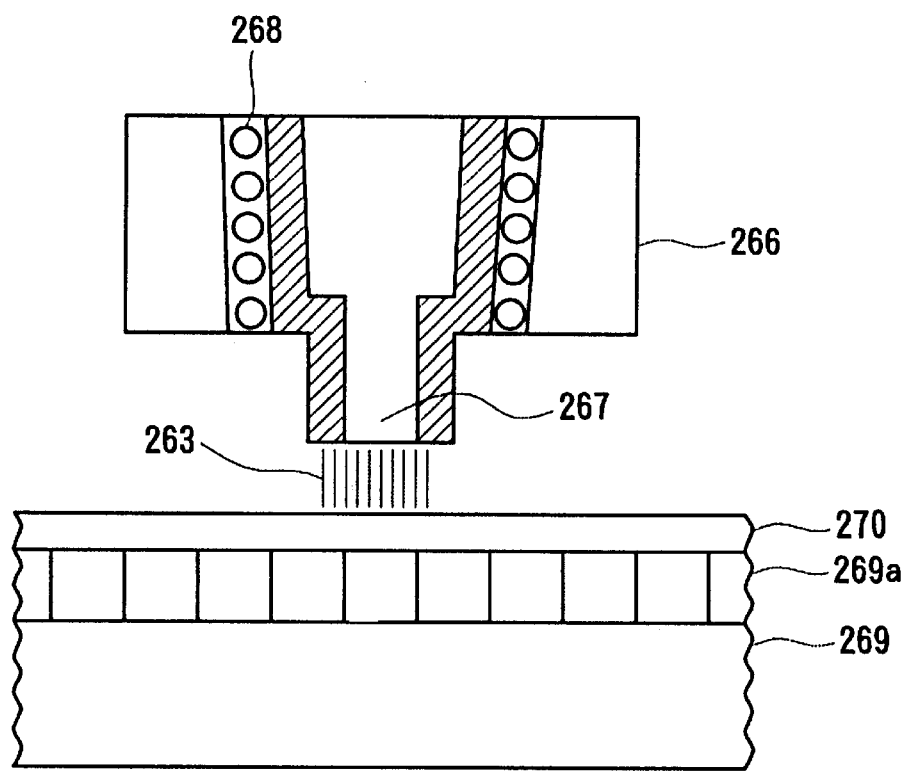
F I G. 41

MICROFABRICATION OF PATTERN IMPRINTING

BACKGROUND OF THE INVENTION

1. Field of the Invention

The present invention relates to methods for imprinting micro-patterns, and relates in particular to a technique of evanescent(proximity)-field-assisted fabrication of two-dimensional micro-patterns of smaller dimensions than the wavelength of light.

2. Description of the Related Art

A typical example of fabrication techniques for making micro-circuit patterns on a semiconductor substrate is photolithography. In this technique, a photo-sensitive material (photo-resist) is coated on a substrate base, and a reduced image of a masking pattern containing micro-circuit patterns is projected on the base by optical means to expose the photo-resist material. The degree of resolution achievable by photolithography is limited by light diffraction effects, and the minimum line width is ultimately limited by the wavelength with respect to light. For this reason, it is necessary to use shorter wavelengths for fabrication of finer patterns. Currently, this is being achieved by using the g-line (436 nm wavelength) or the i-line (365 nm wavelength) of mercury lamp, or KrF excimer laser (248 nm wavelength) or ArF excimer laser (193 nm wavelength), and the trend is towards the use of shorter wavelengths to meet the demand for finer line width.

In recent years, active research has been conducted on the use of evanescent field (proximity field) for fabrication of micro-patterns. An evanescent field is an electromagnetic field produced when light is transmitted through a transmissive object placed at a sub-wavelength distance of a light source. If an object having a micro-pattern surface structure, comprised by high and low structures, is placed within a sub-wavelength of a light source, light is transmitted through the high structures of the structure, and evanescent fields are generated at these locations. Evanescent field diminishes exponentially as the separation distance increases beyond the wavelength of transmitting light. Therefore, if a micro-pattern with height difference of the order of several tens of nanometers is coated with a photo-sensitive material and is placed at a sub-wavelength distance to an exposure light source, light is transmitted only through the high structures, thereby exposing only the coating on high structures of the micro-pattern to the exposure light. In this technique, the line width of the exposed material is governed only by the fineness of the pattern placed in proximity of the light source, not by the exposure wavelength. Therefore, it is possible to produce micro-patterns exceeding the limit imposed by the exposure wavelength.

A known example of micro-pattern fabrication based on the evanescent field effect uses an optical fiber having one end sharpened to a sub-wavelength dimension, and a laser light is injected from the opposite end of the fiber. The sharpened end is placed in contact with or in proximity to (at a sub-wavelength distance) a surface of a substrate base coated with a photo-resist film, then a proximity field is produced in the vicinity of the exposed region, and the light is transmitted through the proximity field and the photo-resist film is exposed to the light. Therefore, by sharpening the tip to a sub-wavelength dimension, it is possible to expose a pattern scribed by a line width of a sub-wavelength dimension on the photo-resist film. The photo-resist film is developed by photo-lithographical technology, then, using the exposed sections of the photo-resist film as the etch-masking, patterned surface of the substrate base is etched to remove the unprotected regions, thereby leaving behind micro-patterns of a sub-wavelength line width.

However, in this technique, the proximity field can only be produced at the tip of the optical fiber opposite to the base, therefore, the exposed pattern is a point. To apply this technique to the production of a two-dimensional pattern of some integrated circuit device, it is necessary to scan the tip in a pattern of the circuit, so that it not only consumes a vast amount pattern-making time but also leads to the need for a complex tip-driving apparatus. Therefore, this technique is considered impractical.

For these reason, there have been attempts to produce micro-patterns using a mask that has a proximity field exposure pattern and transferring the two-dimensional pattern to a substrate base. For example, a prism made of a light transmissive material such as glass and the like is prepared and a photo-mask, having a proximity field exposure pattern of sub-wavelength dimensions, is attached to the bottom surface of the prism. Light is injected into the prism at such an angle that it is totally reflected at the bottom surface of the prism. Next, a substrate base coated with a photo-resist film is placed at a sub-wavelength distance of a proximity exposure pattern so that an evanescent field is produced and a two-dimensional pattern, conforming to the proximity exposure pattern, is exposed on the photo-resist film. In this process, an optical system for injecting a laser beam from an inclined surface of a prism is used, and the incident laser beam is totally reflected at a plane having a proximity field exposure pattern; and then it is transmitted to outside through another inclined surface. A photo-resist film surface of a substrate base is made to contact closely with the proximity field exposure pattern, so as to generate an evanescent field to propagate exposure light along the exposure pattern, and thereby producing micro-patterns having line widths of sub-wavelength dimensions.

The method utilizing the evanescent field described above enables to produce a two-dimensional micro-pattern having line widths less than the wavelength of the exposure light on a photo-resist film of a substrate. However, the method requires that the incident beam be aligned with the inclination angle of a prism, and the optical system is necessarily complex. Also, the exposure pattern section can only accept a small exposure area. And, because the incident light is at an angle to the proximity field exposure pattern, the depth of imprinting is shallow, and because the exposed area increases quickly along the beam line, it is difficult to expose a structure having high aspect ratios on the photo-resist film.

SUMMARY OF THE INVENTION

It is an object of the present invention to provide an optical imprinting apparatus and method for producing a two-dimensional pattern, having line widths less than the wavelength of an exposure light, economically using a simple method and a low cost device.

It is another object of the invention to provide an imprinting method for imprinting two dimensional micro patterns with high aspect ratio.

In order to achieve the above object, there is provided an apparatus, which comprises a waveguide; a proximity field exposure pattern firmly fixed to a section of the waveguide; and a light source for injecting a light into the waveguide.

According to the present invention, by placing a substrate surface close to the proximity field exposure pattern, a portion of the light propagating in the waveguide is transmitted through an evanescent field to expose the substrate surface. Therefore, a compact apparatus having a waveguide having a proximity field exposure pattern and a light source is provided, which is much more compact compared with the conventional stepper device, and is much more economical. Because the waveguide can be made in a flat shape, by combining with a compact semiconductor laser and the like, the overall imprinting apparatus can be made quite compact.

An optical imprinting apparatus is comprised by a light source; and an exposure-mask having a proximity field exposure pattern for radiating an exposure light output from the light source on a photo-sensitive material through an evanescent field; wherein the exposure-mask is provided integrally with the light source.

The apparatus having an integral light source and the proximity field exposure pattern can provide a very compact apparatus, and can eliminate complex optical systems required in the conventional optical systems and produce micro-patterns of sub-wavelength dimensions.

A method for evanescent-field-assisted imprinting is comprised by the steps of: placing a proximity field exposure pattern on a waveguide or on a portion of a light source; aligning a fabrication object having a photo-sensitive film in proximity of the proximity field exposure pattern; injecting a light from the waveguide or the light source into the proximity field exposure pattern so as to imprint the proximity field exposure pattern on the photo-sensitive material by means of an evanescent field formed between the proximity field exposure pattern and the photo-sensitive film.

Because the proximity field exposure pattern is extremely close to the photo-sensitive material, micro-patterns are imprinted by the evanescent field effect to imprint two dimensional patterns using a simple apparatus. Direct use of the light source enables total reflection in a simple manner and a large area can be exposed very uniformly to provide a very effective process.

An exposure-mask for imprinting micro-patterns on a mask base is made in cooperation with an evanescent field generated by exposure light output from a light source, wherein the mask base is transmissive to the exposure light and is provided with micro-patterns comprised by high structures and low structures of sub-wavelength dimensions with respect to a wavelength of the exposure light, and the low structures are embedded with a material of low transmissivity to the exposure light.

The proximity exposure enables micro-patterns to be exposed on a photo-sensitive material, and the low structures to be filled with a low transmissivity material, so that there is no light leaking from such regions of the patterns. The evanescent fields are produced only on the high structures, and a high contrast (large height differences in the micro-pattern) can be produced in the pattern.

It is preferable that the low transmissivity material be a metallic substance. Such a structure can be produced by vapor deposition or sputtering of a metal film, followed by chemical mechanical polishing to flatten the surface of the photo-sensitive material to produce an excellent photomask.

The low transmissivity material may be produced by ion exchange. It is also preferable that fabrication of the mask base is performed by fast atomic beams.

A method for making an exposure-mask having a fine pattern is comprised by the steps of: applying a photo-sensitive coating on a mask base made of a material transmissive to exposure light; fabricating micro-patterns on the photo-sensitive coating using electron beams or X-ray beams; and irradiating with a fast atomic beam using the micro-patterns fabricated on the photo-sensitive film as exposure-mask; thereby imprinting micro-patterns on the mask base.

Micro-patterns can be produced on quartz glass or other transmissive materials together with a photo-sensitive coating and exposure by electron beam or X-rays. Thickness of the photo-sensitive material should be up to twice the size of the micro-patterns. FAB is linear and free of charge accumulation so that insulation materials can be fabricated with micropatterns of high aspect ratios. Parallel plate type FABs are preferable for use here. Also, it is noted that this technique is also applicable to the pattern dimensions of larger than wavelength of the light.

A method for imprinting micro-patterns on a substrate base is comprised by the steps of: applying not less than two layers, including an upper layer of a photo-sensitive film having a thickness dimension of less than the wavelength of exposure light; placing an exposure-mask having proximity patterns in contact with or in proximity of the photo-sensitive film at a sub-wavelength distance so as to generate an evanescent field and expose the proximity patterns on the photo-sensitive film; developing exposed proximity patterns by photo-processing to produce a first etch-mask; fabricating a lower surface of the substrate base using the first etch-mask to produce a second etch-mask comprised by the lower film; and imprinting proximity field exposure patterns on the substrate base using the second etch-mask.

It is again demonstrated that the evanescent field effect promotes production of sharp micro-patterns. The depth of patterns produced by this technique is shallow, and the exposed areas are dispersed quickly along the depth direction. Therefore, thin or film is able to perform precise fabrication.

A method for imprinting micro-patterns on a substrate base is comprised by the steps of: applying a first coating of a photo-sensitive material on the substrate base to a thickness less than a wavelength of an exposure light; placing an exposure-mask having a proximity field exposure pattern in contact with or in proximity of the proximity field exposure pattern at a sub-wavelength distance; exposing the coating through the exposure-mask using the exposure light through an evanescent field and developing by photo-processing to produce first imprinted patterns on the first coating; applying a second coating on the first imprinted pattern of the photo-sensitive material; dissolving the first coating to liftoff the first imprinted patterns, thereby leaving second imprinted patterns formed by the second coating; and fabricating the substrate base using the second imprinted patterns as etch-mask to produce micro-patterns on the substrate base.

Using such an exposure-mask, thick film as a second coating can also be imprinted to produce imprinted micro-patterns. Thick film has excellent tolerability so that high aspect structures can be produced readily by using the etch-mask technique with thick films.

It is preferable that the thickness of the first coating is essentially the same as a minimum dimension of the proximity field exposure pattern. It enables sharp imprinting of minimum dimensions. It is preferable that the fabrication of the substrate base or an exposed lower layer is performed using a fast atomic beam. FAB has highly linear etching property and free from charge accumulation so that micro-patterns of high aspect ratios can be produced efficiently.

An exposure-mask for evanescent-field-assisted imprinting having a proximity field exposure pattern of sub-wavelength dimensions is fabricated on a transmissive material, wherein the proximity field exposure pattern is produced by imprinting a master proximity field exposure pattern provided on a mother mold.

This technique is suitable for mass production of proximity field exposure patterns at low cost. It can eliminate the necessity for expensive original mask for evanescent field assisted imprinting which can be applied to the production of LSI circuits.

It is preferable that the mother mold is a metal mold.

Metal mold can easily be detached from glass or resins so that the mask can be preserved well. Also, metals are excellent for producing micro-patterns and for imprinting purposes.

A method for making an exposure-mask is by preparing a mother mold having a pattern; pouring a transmissive material in a molten state into the mother mold; cooling and detaching a solidified pattern from the mother mold, thereby producing an imprinted proximity field exposure pattern.

It is therefore possible to use low cost materials such as plastics, resins (PMMA) to produce micro-patterns, and the cost of making exposure-mask is reduced.

It is preferable that detaching from the mother mold is based on differential thermal expansion effects of materials constituting a mother mold and an imprinted pattern.

This separation technique is enhanced by a metal mold when glass and resins are used for making duplication mask.

It is preferable that the mother mold is pre-coated with a soluble film, which is dissolved when detaching a solidified pattern from the mother mold.

This technique is cost effective and can easily be applied to many applications when making duplication mask.

The base may be coated with $SiO_2$ followed by a resist film to make a fine pattern, which is used as mask to etch the $SiO_2$ film with FAB, and a metal film is further deposited, and the $SiO_2$ film is removed by dissolving in HF solution. The metal film can be used as a mother mold.

A method for imprinting micro-patterns on an imprint base by preparing a pattern template having a fine structure, coating a semi-solid material on the pattern template; pressing the semi-solid material on the pattern template to produce a duplicated pattern of the fine structure; irradiating the duplicated pattern to produce the imprint base having the micro-patterns.

This technique eliminates the need for alignment of micro-patterns and expensive optical equipment is not needed, so that low cost mass production of micro-patterns is made possible. Also, it is noted that this technique is also applicable to the pattern dimensions of larger than wavelength of the light.

It is preferable that the pattern template is a roller having the fine-structure fabricated on an roller surface, and the fine-structure is duplicated on an imprint base by press rolling on a semi-solid material.

This technique is quite adaptable and can be applied to a curved surface.

It is preferable that the pattern template is a flexible material disposed away from a semi-solid imprint base, which is roll pressed by a roller template to intimately contact the roller template and thereby imprinting the micro-patterns on the semi-solid imprint base.

This technique is applicable to non-flat surfaces to imprint micro-patterns accurately.

A method for imprinting micro-patterns on an imprint base by preparing a pattern template having a fine structure comprised of high and low structures, pouring a molten material on the pattern template; cooling the molten material on the pattern template; detaching a solidified pattern to produce a duplicated pattern of the fine structure to produce the imprint base having the micro-pattern.

This technique allows pouring of molten material to produce an imprint base having micro-patterns so that it is effective for low cost mass production.

A method for fabricating micro-patterns on an imprint base is by applying a photo-resist layer coating on a pattern template; scribing a fine structure on the photo-resist coating by means of electron beams or X-ray beams and developing by photo-processing to fabricate etch-mask; irradiating with a fast atomic beam through the etch-mask to produce an imprint base having the fine structure duplicated thereon.

Electron or X-ray beams do not present diffraction problems so that micro-patterns can be produced on resist film easily, which is used as etch-masking for FAB to produce micro-patterns of high aspect ratios on imprint bases. Also, it is noted that this technique is also applicable to the pattern dimensions of larger than wavelength of the light.

A method for imprinting on an imprint base for LSI devices is by preparing an exposure-mask having a fine structure of sub-wavelength dimensions; exposing a substrate base of a semiconductor material coated with a photo-sensitive material through the exposure-mask in an evanescent field so as to imprint the fine structure on the LSI device base.

This method allows micro-patterns to be imprinted on photo-resist film easily and effectively. The exposure apparatus is comprised only by a mask having a proximity field exposure pattern, eliminating the need for complex optics. The apparatus cost is low and the production cost is low.

A method for imprinting micro-patterns on LSI devices is by preparing a pattern template having a fine structure of sub-wavelength dimensions; pressing the pattern template on a semi-solid material coated on a substrate base of a semiconductor material so as to imprint the fine structure on a surface coating; and etching the surface coating using imprinted patterns as etch-mask to produce the LSI devices.

Imprint template in this case corresponds to normal photo-mask used in fabrication of LSI devices, but the template has micro-patterns which can be replicated readily by pressing on semi-solid materials. The imprinted patterns are used as etch-mask for FAB to produce micro-patterns of high aspect ratios on an LSI base.

An optical data recording medium contains recorded signals fabricated using a method of evanescent-field-assisted fabrication.

Signal bits produced by the evanescent field effects has micro-patterns of sub-wavelength dimensions, so that the density of recording can be increased in quantum steps.

An optical data recording apparatus is comprised by: a recording medium having micro-patterns of sub-wavelength dimensions, with respect to signal light, having different transmissive and reflective properties; a light source for signal light; and a detection section disposed opposite to a patterned surface of the recording medium.

The data recording medium can store significantly more data compared with similar conventional recording medium. The apparatus is a stationary recording apparatus of an extremely overall compact size. No moving parts are involved in such an apparatus, so that potential wear is reduced and accompanying operating noise is minimal.

An magnetic-optical recording head is comprised by an optical fiber having a sharpened tip of a sub-wavelength dimension with respect to signal light, and a magnetic field generation coil for magnetizing a magnetic layer disposed in proximity of the sharpened tip in association with the magnetic-optical recording head.

Signal transfer is carried out through the evanescent field at the nano-tip of the fiber, so that data transfer, in association with the magnetic field produced in the head and storage medium of micro-sized dimensions, to lead to a quantum increase in data density and performance speeds.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a perspective view showing a concept of an embodiment of the photo-driven imprinting apparatus.

FIGS. 28A~28E are illustrations of the steps for a method of micro-pattern imprinting in a variation.

FIG. 33 is a cross-sectional view showing a cell structure of DRAM in a semiconductor device.

FIG. 41 is schematic diagram of a reading head in an optical-magnetical disc apparatus in the embodiment.

DETAILED DESCRIPTION OF THE PREFERRED EMBODIMENTS

Figure 2A:
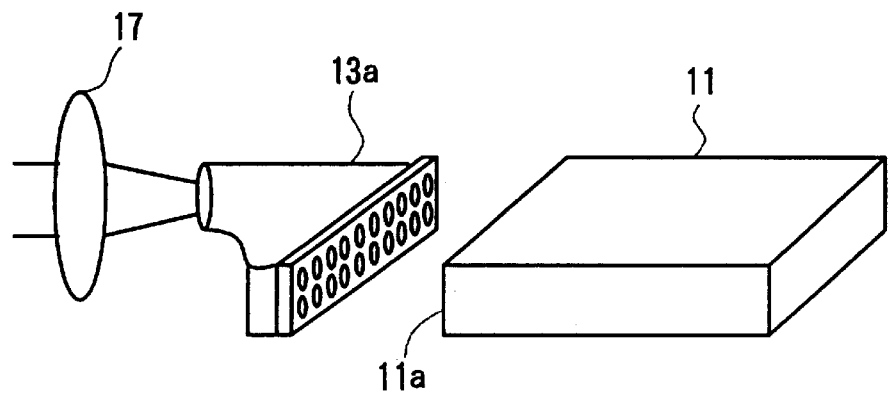
FIGS. 2A~2C are schematic diagrams of light sources and waveguides.

FIG. 1 shows an embodiment of the photo-driven imprinting apparatus. A proximity field exposure pattern (shortened to proximity pattern hereinbelow) 12 is fixed to a section of a waveguide 11. A light source 13 is connected to an input surface 11a of the waveguide 11, and a light input into the input surface 11a propagates through the waveguide 11. The waveguide 11 is a flat plate, and its upper and lower surfaces are treated so as to obtain total reflection between the two surfaces. For example, all the surfaces, excepting both sections of the input surface 11a and the proximity pattern 12, are coated with a metal film. The waveguide 11 is made of quartz glass or a light-transmissive material such as polyimide, and excepting the input/output surfaces, the surfaces are coated with a metal film such as Cr, Al, Ag or Au. Therefore, an incident light beam entering from the input surface 11a are trapped inside the transmissive material of the waveguide 11. Thus the wavesguide 11 can be broadly characterized as a container in which light is enclosed therein.

Instead of coating all the surfaces with a metal film, the optical transmissive material may be made of a core and a cladding to produce a total reflection condition. Total reflection may be produced by constructing the waveguide 11 with a transmissive material, and its lateral surfaces are coated with a metal film, and the upper and lower surfaces may be exposed to the atmosphere. In any case, the important conditions are to arrange the waveguide so that the light input from the input surface 11a is trapped within the waveguide 11, and when an object is placed in proximity of the proximity pattern 12, an evanescent field is produced on the surface of the object, and the trapped light energy is released and the light is propagated therethrough.

Figure 2B:
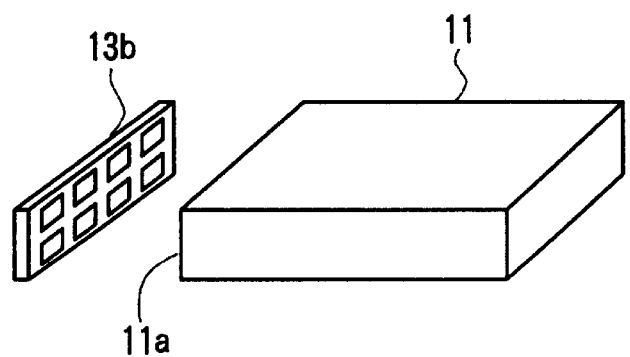
Figure 2C:
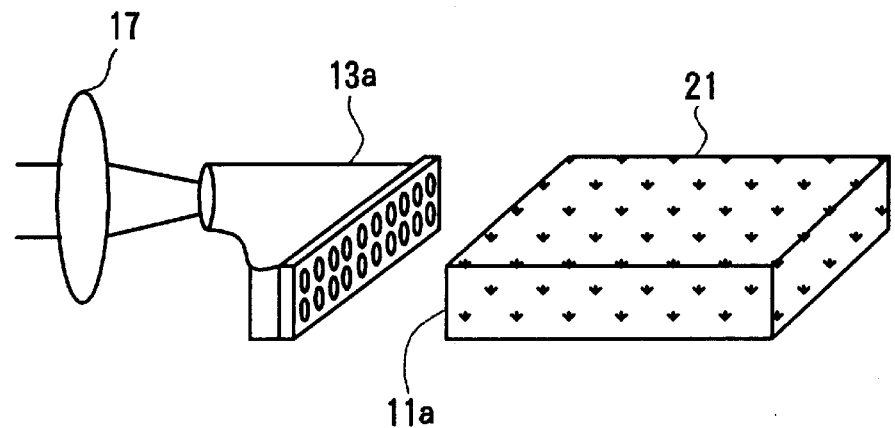

FIGS. 2A~2C show specific arrangements of the light source 13. A fiber bundle 13a is used to transmit light emitted from a mercury lamp or a laser beam source, and the light is focused through a lens 17 and is injected into one end of the fiber bundle 13a and output from the opposite end thereof to enter through the input surface 11a of the waveguide 11, as shown in FIG. 2A. In this case, the light source may emit laser light, mercury lamp light or white light. FIG. 2B shows a semiconductor laser 13b for generating light beam of spectrum from red to blue from the surface thereof, which propagate at right angles to the surface thereof. Therefore, it is suitable for the light beam to be input into the waveguide 11 from the surface 11a.

FIG. 2C shows a waveguide 21 having fluorescent particles of Mg, Ti or It in the waveguide 21. Such fluorescent particles generate a light having a wavelength according to the characteristics of the nature of the particle, for example, when the particles are excited by white light input from the fiber bundle 13 a. Namely, when the particles are excited by the injected white light, then the particles emit a light beam having a wavelength. This device can thus acts as a wavelength converter, and enable to use low cost white light (e.g. by light source 13a outside of wavepuide) to generate a light of a wavelength suitable for use in the evanescent field. In general, a photo-sensitive material responds to a particular wavelength so that wavelength conversion is required to select the most suitable wavelength for a particular photo-sensitive material. Also, it is preferable to use shorter wavelength because shorter wavelengths exhibit less dispersion of light. Therefore, a wavelength conversion device enables to utilize low cost white light to produce a particular wavelength suitable for a particular photo-sensitive material.

Thus each of the embodiments of FIGS. 2A~2C employs a waveguide as a container in which light is enclosed, having an exposure-mask having a proximity field exposure pattern fixed thereto. In each of these embodiments a light source for supplying light in the container is provided, with the primary light source or all of the light source being located outside of the container.

Also, it is desirable that the waveguide 11 be made of a flexible material. Such a flexible material enables to fabricate micro-patterns of narrower line widths than the wavelength of exposure light on a curved surface by using evanescent field effect. For example, light-transmissive material of polyimide offer sufficient flexibility for imprinting micro-patterns on a curved surface.

A waveguide may be made of a $SiO_2$ film deposited on a silicon wafer. Such $SiO_2$ films are transparent to visible light and are sufficiently transmissive to wide area of wavelengths. Such a waveguide device can work in the same manner as described earlier by using a proximity pattern to generate an evanescent field to imprint micro-patterns.

It is preferable that an exposure-mask having a proximity pattern is detachable from the light source or waveguide. This permits the exposure-mask to be cleaned or replaced when the mask is contaminated with the photo-sensitive material. The light source may made of a container having a gas that emits a light when it is excited by an electron beam or a laser beam. This type of light source is convenient because there is no need for placing a physical light source inside the container to generate a wave having a suitable wavelength.

The light source may also contain a gas such as Ar, Kr in the waveguide so that the gas molecules may be excited by irradiating with an electron beam being scanned. This arrangement enables to generate a high output power using a relatively fine electron beam so that sufficient power can be delivered to the photo-resist film through the evanescent field. Similarly, ionic or molecular species may be substituted for a gas to generate an excited light. Exposure of a proximity pattern by exciting the ionic or molecular species with an electron beam enables to generate a light for imprinting micro patterns through the exposure-mask.

Figure 3:
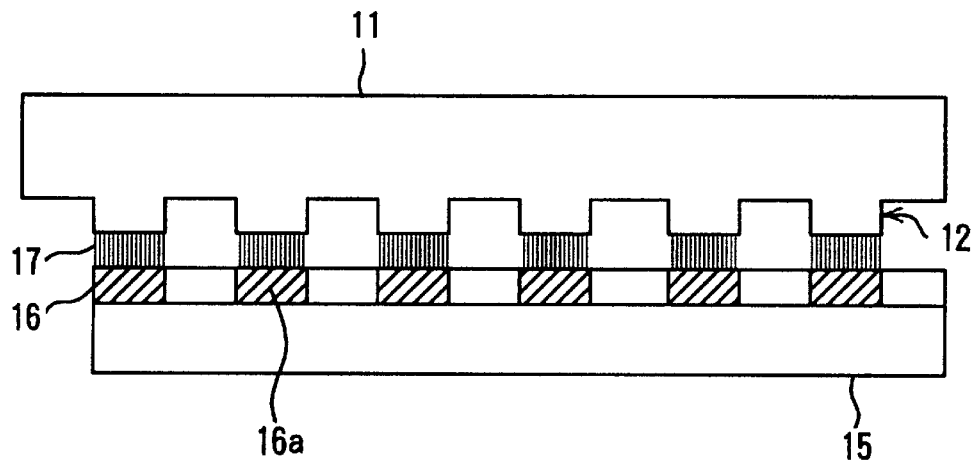
FIG. 3 is a side view of exposure device using an evanescent field.

FIG. 3 shows an enlarged cross sectional view of a proximity pattern. A proximity pattern 12 is provided on the bottom surface of the waveguide 11, and in this case, the micro-pattern on the proximity pattern 12 has line widths in a range of 50~100 nm. The height of the micro-pattern is approximately several tens of nanometers. In this case, the proximity pattern 12 is either brought into contact with or placed in proximity (several tens of nm) of an object surface coated with a photo-resist film 16 on an imprint base 15, to produce an evanescent field 17 on the photo-resist film 16. Under this condition, the light trapped inside the waveguide 11 is released through the evanescent field 17, i.e., an electromagnetic field 17, and exposes opposing regions 16a of the photo-resist film 16. The exposed regions 16a correspond to line widths of the high parts of the proximity pattern 12 to produce micro-patterns of line widths determined by the dimensions of the proximity pattern, independent of the wavelength of the light trapped inside the waveguide 11. The exposed substrate is developed by using the normal photolithographic procedure to produce micro-patterns on the photo-resist film 16, which is used as the etch-mask to etch the imprint base 15 to produce a micro pattern having line widths narrower than the wavelength of exposure light.

Figure 4A:
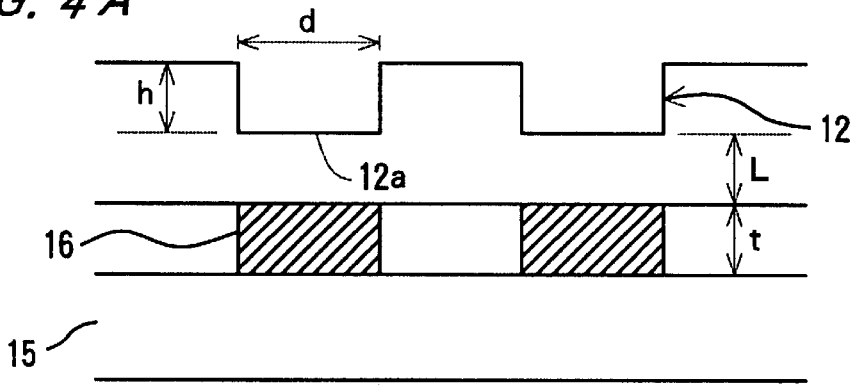
FIGS. 4A, 4B are illustrations of the evanescent field effect to show, respectively, a profile of a proximity field exposure pattern, and the dependence of the transmission characteristics of light on the distance of separation between high points of the proximity field exposure pattern and the photo-resist film.
Figure 4B:
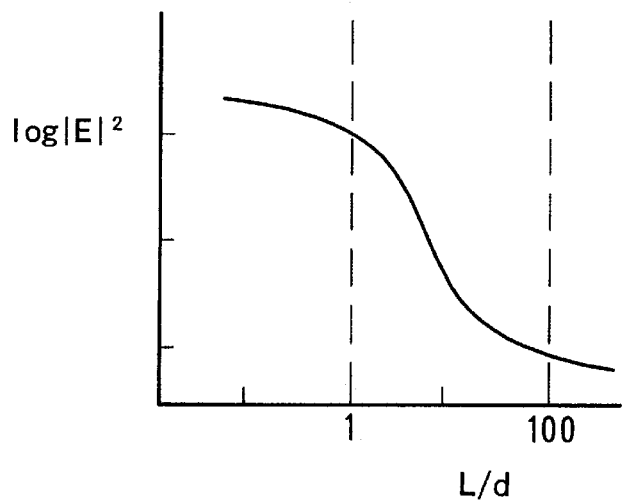
Figure 12A:
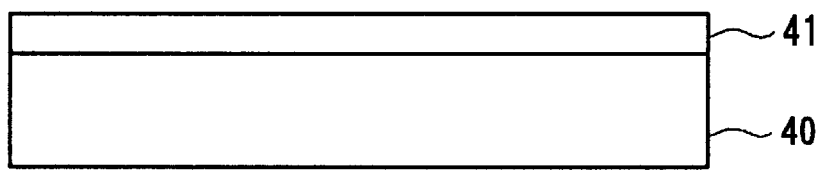
FIGS. 12A~12E are a variation of the steps shown in FIGS. 11A~11F.
Figure 12B:
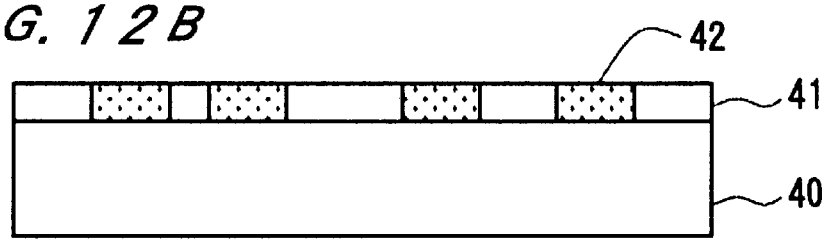
Figure 12C:
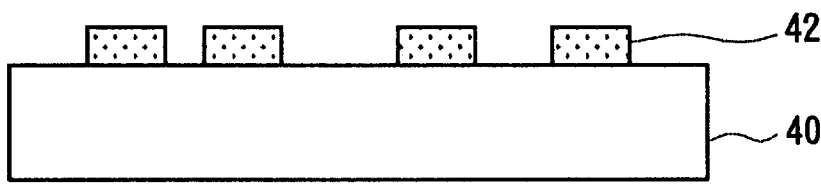
Figure 12D:
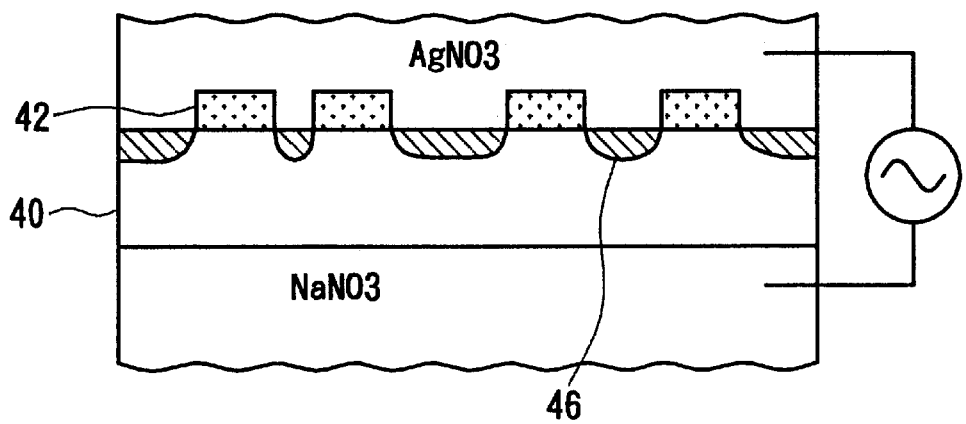
Figure 12E:
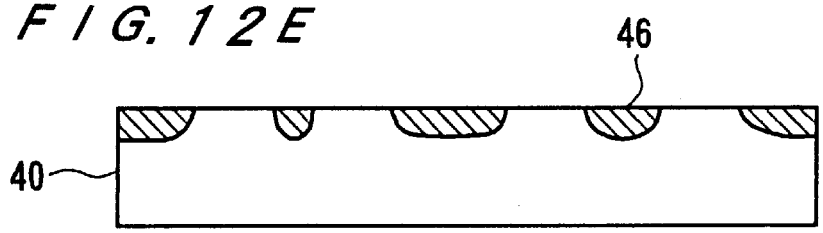
Figure 13A:
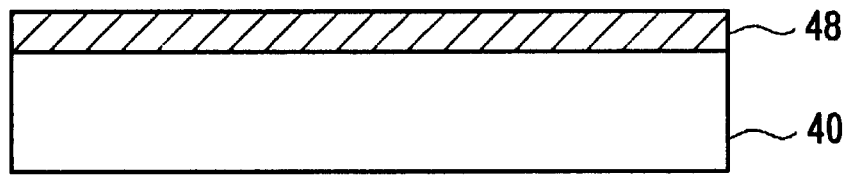
FIGS. 13A~13E are a variation of the steps shown in FIGS. 11A~11F.
Figure 13B:
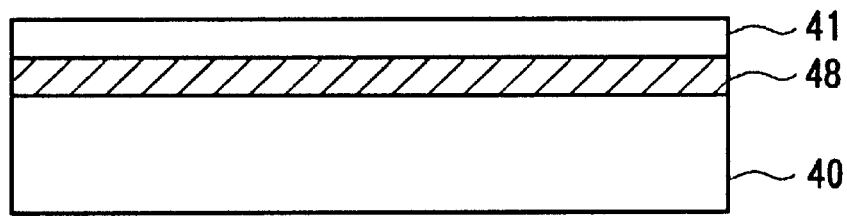
Figure 13C:
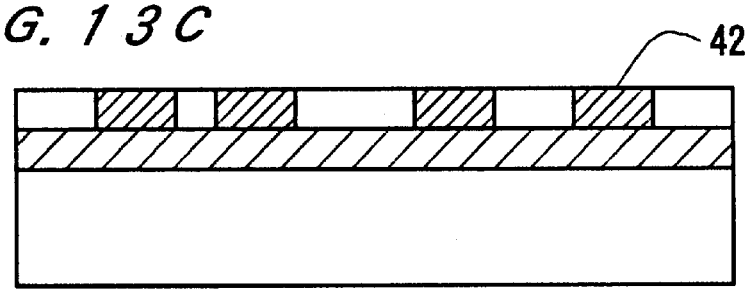
Figure 13D:
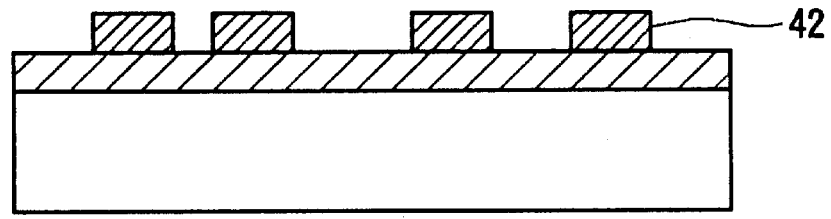
Figure 13E:
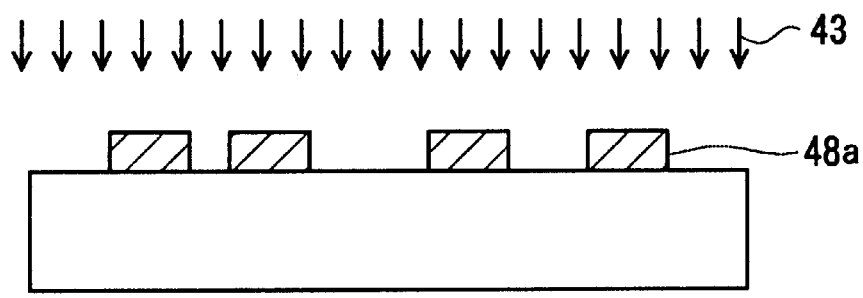

FIGS. 4A, 4B show an characteristic property of the evanescent field. The profile of the evanescent field is shown in FIG. 4A. The width d of the high spots in the proximity pattern 12 and the distance of separation L between the photo-resist film 16 on the wafer 15 are related as shown in FIG. 12B. As the ratio of L/d becomes less than 1, a rapid release of light energy takes place from the waveguide 11 to the photo-resist film 16, as shown in FIG. 4B. As the proximity pattern 12 moves away from the photo-resist film 16, and the ratio L/d increases, transmission of light drops rapidly.

Figure 5:
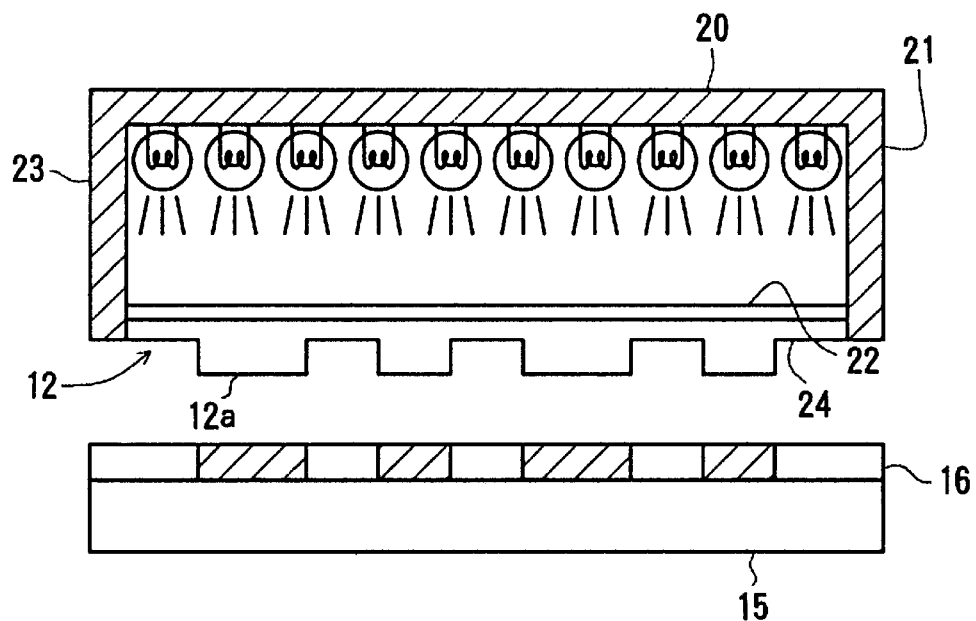
FIG. 5 is a schematic diagram of another embodiment of the photo-driven imprinting apparatus.

FIG. 5 shows another embodiment of the evanescent-field-assisted imprinting apparatus. A light source 20 is comprised by a container 21 and a bottom plate 22 made of a transmissive material, and a lamp array 23 is disposed inside the container 21. Lamp array 23 can be comprised by mercury lamps, and high light energy is released towards the bottom plate 22. An exposure-mask 24 having a proximity pattern 12 is detachably attached to the bottom plate 22. An imprint base 15 with a photo-resist film 16 is placed either in close contact with the proximity pattern 12 or placed within less than 0.1 $\mu$m distance to form an evanescent field between the high structure 12a and the photo-resist film 16, and the light is transmitted to expose the corresponding sections of the photo-resist film 16, as described in the foregoing embodiments.

The construction of the apparatus of this embodiment is simplified because the exposure-mask 24 is placed close to the light source made of an array of lamps.

The mask 24 is detachable from the bottom plate 22 so that the mask 24 can be cleaned and re-used by removing any material that may adhere to the mask 24. The mask may be made disposable by using a low cost material, and also, the mask 24 and the bottom plate may be made as a single unit and not detachable.

Figure 6:
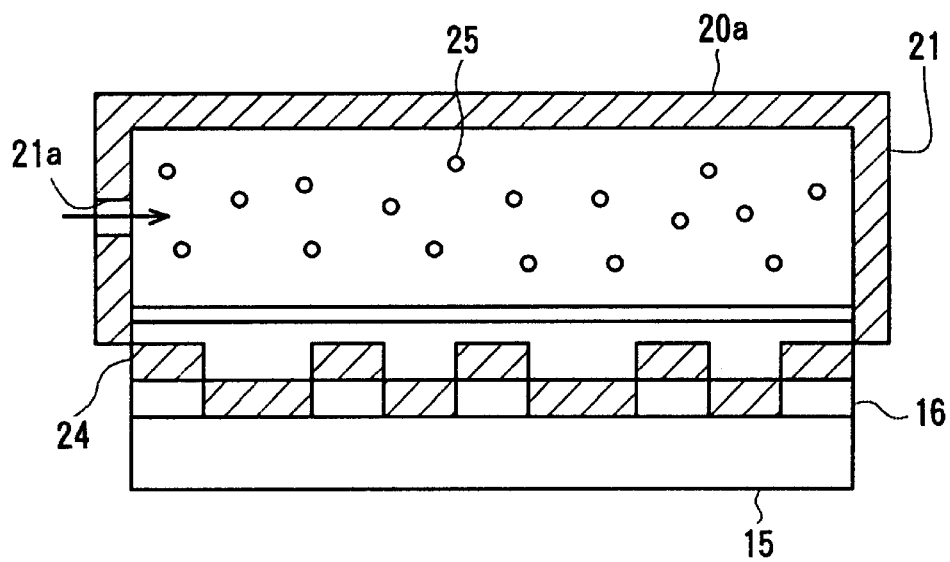
FIG. 6 is a schematic diagram of a variation of the embodiment shown in FIG. 5.

FIG. 6 shows a variation of the above photo-driven imprinting apparatus. This apparatus has a light source 20a which has a light-emitting gas 25 sealed in a space formed between a container 21 having a window 21a and a bottom plate 22. Gases such as Ar, Kr are suitable as a light-emitting gas. An electron beam or a laser beam is irradiated through the window 21a. The gas 25 is activated when irradiated by these beams and emits a light. As described in the foregoing embodiments, an evanescent field is generated when the high points of a proximity pattern 12 is brought in proximity of a photo-resist film 16. This arrangement is advantageous for making a thin light source, by removing the necessity for having a lamp array inside the apparatus.

Figure 7:
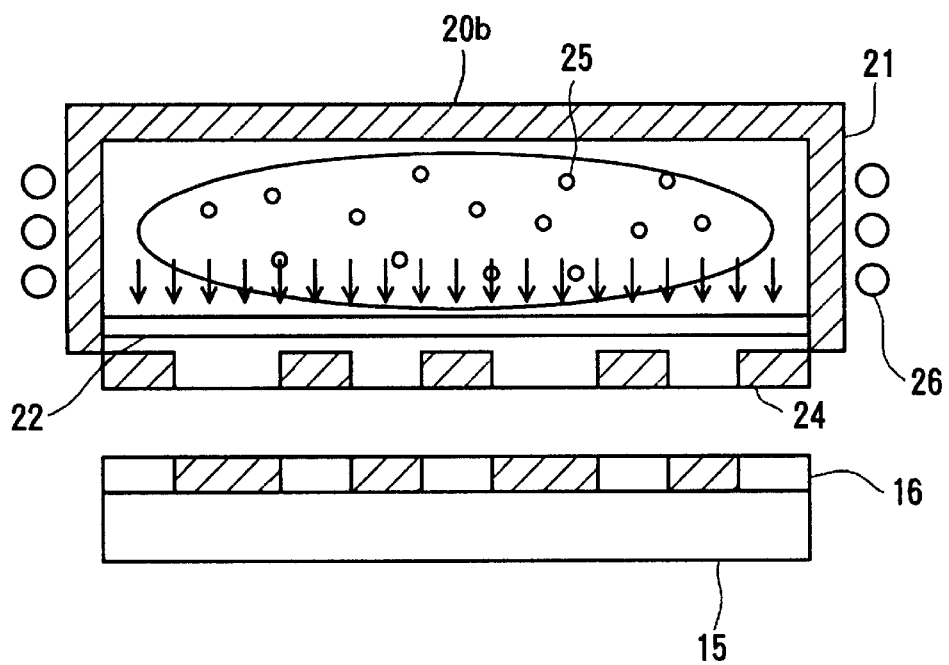
FIG. 7 is a schematic diagram of still another variation of the embodiment shown in FIG. 5.

FIG. 7 shows still another variation of the foregoing apparatus. The apparatus has a container 21 and a bottom plate 22, and a gas 25 such as Ar, Kr is sealed inside the container 21. A light source 20b in this case has an induction coil 26 on the outside of the container 21. The container 21 is made of quartz glass or a ceramic material. The induction coil 26 is supplied with a high frequency current of 13.56 MHz for example, to excite the gas 25 to generate a plasma inside the container 21, which emits a light. As shown in previously mentioned embodiments, the light is used to expose the proximity pattern 12 on a photo-resist film 16 by evanescent field effect. The applied power may be 2 GHz. Microwave.

Figure 8:
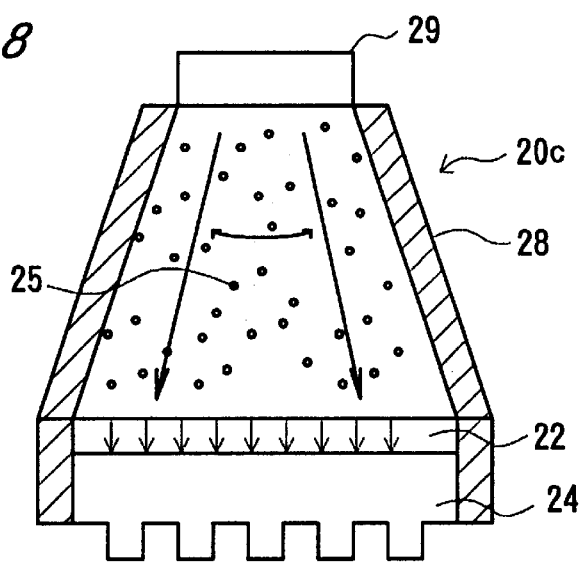
FIG. 8 is a schematic diagram of still another variation of the embodiment shown in FIG. 5, which produces a light generated by electron beam scanning of a photo-activated gas.

FIG. 8 shows still another variation of the apparatus. The container 28 is shaped in a trapezoid profile, and an electron beam generating/scanning device 29 are provided in the upper section. A light-emitting gas 25 such as Ar, Kr is sealed in the space formed between the container 28 and the bottom plate 22, as before mentioned. An electron beam generated by the device 29 scans the space in the container to generate a light which is used to expose the proximity pattern 12 as before mentioned. Electron beam may be replaced with a laser beam.

Figure 9:
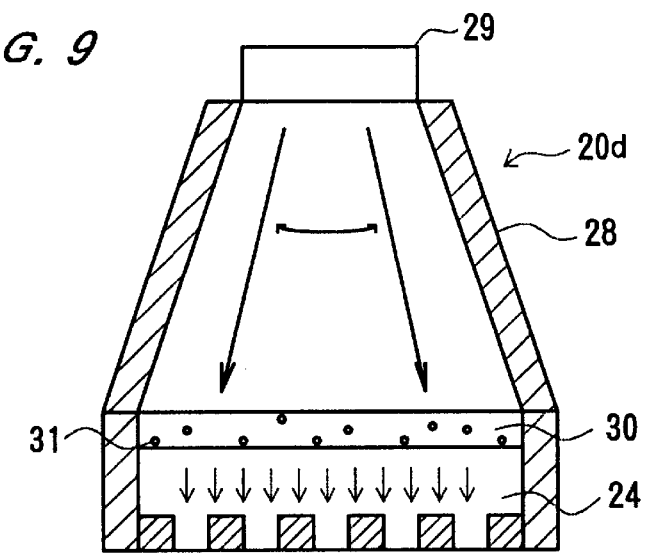
FIG. 9 is a schematic diagram of still another variation of the apparatus in FIG. 8, which produces a light generated by electron beam scanning of light-generating particles.

FIG. 9 shows still another variation of the apparatus shown in FIG. 8. Instead of filling a fluorescent gas in the container, a light source 20d is provided inside the bottom plate 30 containing fluorescent particles 31 such as atoms, ions or molecules. For example, a fluorescent material such as rhodamines or ions 31 of Mg, Ti is contained in the bottom plate 30. An electron beam generated from the device 29 scans the space to excite the particles 31 to generate an exposure light. This method is advantageous because the exposure light is generated very close to the exposure-mask 24 having the proximity pattern, and has a high energy in a fine beam generated by a relatively fine electron beam, thereby producing a light of high energy to expose micro-patterns on the photo-resist film.

Figure 10:
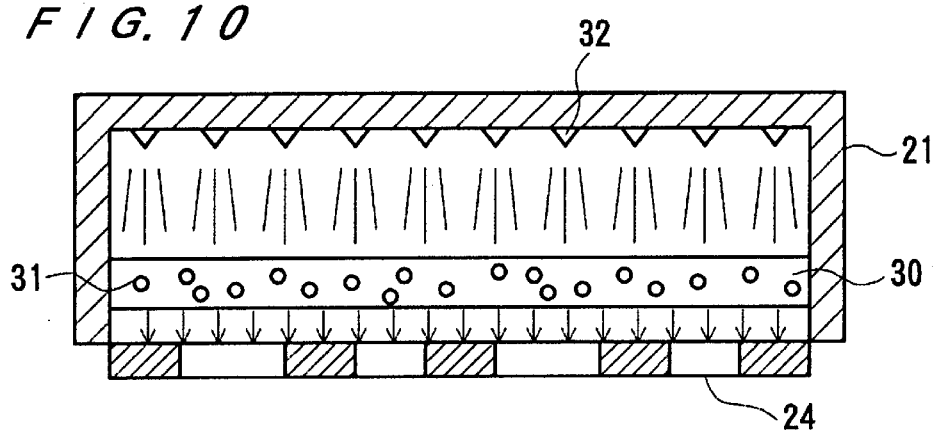
FIG. 10 is a variation of the apparatus shown in FIG. 9.

FIG. 10 shows still another variation of the apparatus. Instead of the electron generating/scanning device, a micro-emitter array or a laser 32 is used, which generates a light from a surface thereof at right angle. The light source 20e irradiates the fluorescent particles 31 sealed inside the bottom plate 30 to produce a surface generated light that expose the mask 24 having a proximity pattern on the photo-resist film(not shown). Compared with the apparatus that produces spot like light sources by scanning of individual gases or particles, this apparatus produced a two-dimensional beam in one operation, making it particularly suitable for imprinting apparatus, when it is desired to have a thin structure.

Thus, in each of the embodiments of FIGS. 5–10, a container 21 or 28 is provided in which light is enclosed. The light source of each of these embodiments is provided inside of the container, with an exposure-mask having a proximity field exposure pattern fixed to a section of the container.

Next, embodiments regarding the exposure-mask will be presented. Such masks have high portions and low portions of the micro-patterns shown in FIGS. 3 and 4A. However, there is a problem that light leaking occurs through the low portions of micro-patterns formed on the mask, making it difficult to obtain high contrast exposure. In the following embodiments, a material of low transmissivity is embedded in the low (groove) structure of the micro-pattern.

Figure 11A:
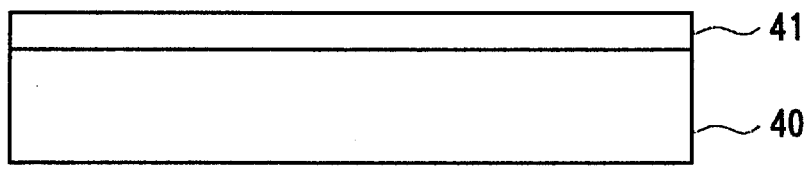
FIGS. 11A~11F are illustrations of steps for making a photo-mask having a proximity field exposure pattern.
Figure 11B:
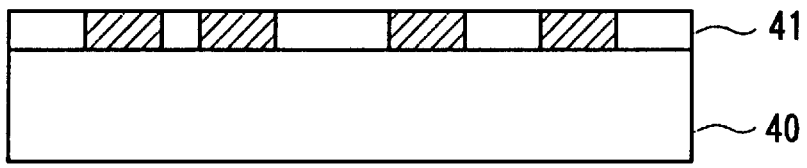
Figure 11C:
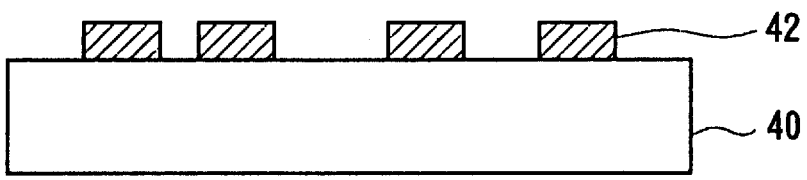

FIGS. 11A through 11F show an embodiment related to a method of making the exposure-mask having a proximity pattern. FIG. 11A shows a quartz glass plate used in preparing a transmissive base 40 on which a photo-resist coating 41 is applied. Prebaking is applied as shown in step of FIG. 1B, and electron beam exposure is carried out to produce a proximity pattern of several tens of nanometers. The electron beam lithography produces line width and line spacing dimensions of 1 to 100 nm. Post-baking is carried out as shown in step of FIG. 11C, and after rinsing, the exposed pattern is developed to remove the unexposed regions in the pattern, thereby obtaining an exposure-mask 42. Instead of an electron beam lithography, a combination of X-rays and a reticule may be used. These methods are not subject to diffraction effect of the light so that the fabrication of micro-dimensions mentioned above is possible.

After applying a photo-resist, a soluble conductive film of 10~50 nm thickness may be coated. This coating eliminates static charges produced by electron beams, and aids in producing high quality micro-patterns.

The surface is then irradiated with a fast atomic beam (FAB) 43, which shows excellent linearity of the etching beam and no buildup of static charges, to etch the exposed surface to produce micro-patterns having 10~50 nm high and low structures on the proximity pattern 12, to be used for the micro-pattern fabrication on a photo-resist film through the evanescent field as shown in FIG. 3. The use of FAB for exposure enables to produce micro-patterns, having a high aspect ratio and sub-wavelength dimensions, on a substrate. It is preferable that FAB is generated by a parallel plate type source so that a large area can be exposed using a particle beam of a highly linear penetration behavior.

In this embodiment of the method of producing an exposure-mask, because a material of low transmissivity is embedded in the grooves, the following step is further carried out. As shown in step of FIG. 11E, a metal film 45 such as Al, Ag or Au is vapor deposited. And, as shown in step of FIG. 11F, chemical mechanical polishing is applied to produce a flat surface, to produce a proximity pattern having the grooves filled with a low transmissivity metallic material 45a at low structures.

Exposure-mask made by such a process forms evanescent field on the photo-resist film only at high structures of the pattern so that light leaking from the low structures is eliminated to enable high contrast exposure, thereby performing high aspect ratio micro fabrication in the etching of micro-patterns. FIGS. 12A~12E show a method of making the exposure-mask in a variation of FIGS. 11A~11F. In this method, embedding of low transmissivity material is carried out by using ion exchange process. A glass plate of high transmissivity containing Na is used, and the Na ions are replaced with Ag ions to fill in the grooves. First, a resist pattern is produced on the glass substrate, the steps A, B and C are the same as before.

Figure 11D:
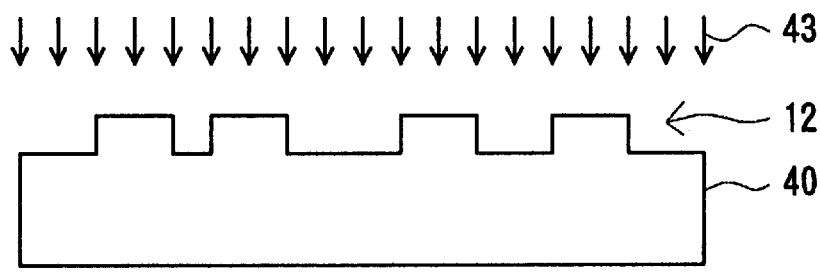
Figure 11E:
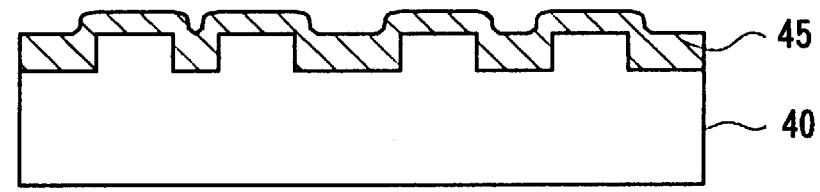
Figure 11F:
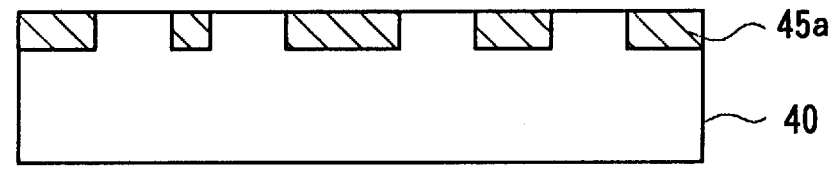

As shown in step of FIG. 11D, after making a resist pattern 42, the resist pattern side of the plate 40 is immersed in a solution containing $AgNO_3$, for example, and the opposite side is immersed in a Na containing solution, and the two sides are connected to a dc or ac source. Na ions in the glass plate is replaced by the $Ag^+$ ions in this process, and light transmissivity through the low structure is diminished. Those regions of the glass plate covered by the resist material has the original transmissive property, so that differential transmissivity is produced, caused by the low structures having the blocking material 46 and high structures of high transmissivity. As shown in step of FIG. 11E, the resist film 42 is removed to produce a proximity pattern having a flat surface and a blocking material 46 embedded in the grooves. As before mentioned, high contrast exposure and other benefits are performed.

Such a structure may be produced by ion injection in local low structures to produce a structure having differential transmissivity.

FIGS. 13A~13E are another variation of a method for making the exposure-mask. As shown in step of FIG. 13A, a metal (conductive) film 48 such as Cr, Al is deposited to a thickness of 10~50 nm on a transmissive base 40 such as quartz glass. A resist film 41 is coated and the base 40 is prebaked, as shown in step of FIG. 13B. And, a proximity pattern is produced by exposing the resist film to electron beams, and after rinsing and post baking as shown in step of FIG. 13D, a resist pattern 42 is produced.

Using the resist pattern 42 as the exposure-masking for FAB to expose the base to produce a two-dimensional pattern 48a of metal film on the base 40. This mask can be used as the mother mask, and enables to mass produce replicated proximity pattern produced by hot pressing on a plastic resin material of a suitable transmissivity.

Fast atomic beam is advantageous because of no buildup of static charges when fabricating insulating materials, and eliminate the problem of dispersion caused by electron particle rebounding, thereby enabling to utilize linearity of the etching beam to produce superior fabrication. Micro-patterns having line widths and line spacings in a range of several tens of micrometers can thus be produced. Spacing between the line patterns can be larger than the wavelength of the exposure light.

According to the method of imprinting micro-patterns can be produced on a metal film deposited on a glass base using FAB, it can be used directly as a mask in the process for making general integrated devices such as LSI devices. In such cases, micro-patterns need not to be limited to sub-wavelength dimensions, and dimensions larger than the wavelength of the light are of course acceptable when required.

As explained above, the present method of making a proximity pattern enable to economically produce a compact apparatus.

Also, the exposure-mask having the proximity pattern can produce high contrast exposure because of differential transmissivity so that the advantage of evanescent field exposure method can be fully utilized.

FIGS. 14A through 14E show an embodiment related to a method of evanescent-field-assisted imprinting. A base 51 is prepared by coating the surface with a first resist material 52 and a second resist material 53, as shown in step of FIG. 14A. The base 51 may be a semiconductor material such as Si, GaAs or an insulator such as $SiO_2$. The second resist material 53 is coated to a thickness of about 500 nm. The first resist material is coated to a thickness of less than the wavelength of the light and preferably less than the minimum size of the proximity pattern, approximately 30~50 nm, and should have a high responsivity to the exposure light used to generate the evanescent field. For example, first resist layer 52 is polyimide and second resist layer 53 is a normal polymeric photo-resist.

Figure 14A:
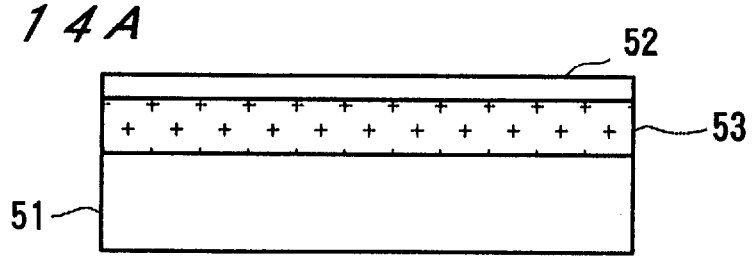
FIGS. 14A~14E are illustrations of the steps for micro-pattern imprinting method in an embodiment.
Figure 14B:
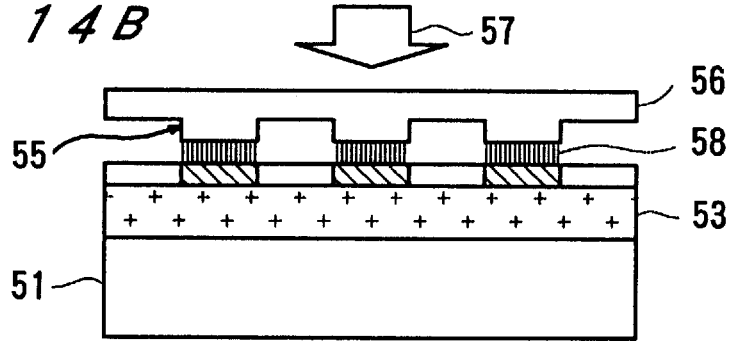

Exposure is carried out as in step of FIG. 14B. Exposure-mask 56 having a proximity pattern is placed in contact with or in proximity (at a sub-wavelength distance) of the first resist layer 52. Light 57 is radiated from the opposite side to the proximity pattern 55 on the mask 56 under total reflection conditions, and evanescent fields are produced between the proximity pattern 55 and the first resist layer 52, to transmit the light 57 and exposes the field-affected regions 58 of the first resist layer 52. In this case, the widths of the pattern 55 should be several tens of nanometers so that the patterns produced on the first resist layer 52 will exhibit narrow widths corresponding to the proximity pattern 55. Therefore, the narrow width patterns can be imprinted to be less than the wavelength of the exposure light.

As described above, light transmitted through the evanescent field has low power and is susceptible to dispersion, but the patterns on the first resist layer 52 is made so as to be less than the minimum size of the pattern 55, so that the first resist layer 52 can be exposed to its total depths and horizontal dispersion is eliminated. The pattern on the exposure-mask 56 is clearly imprinted on the first resist layer 52. The second resist layer 53 is treated to be non-responsive to the processing light, by heat treatment and the like, so that the light would not pass through the evanescent field and the first resist layer 52 to expose the second resist layer 53.

Figure 14C:
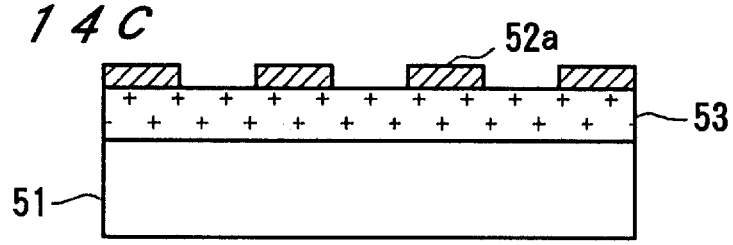
Figure 14D:
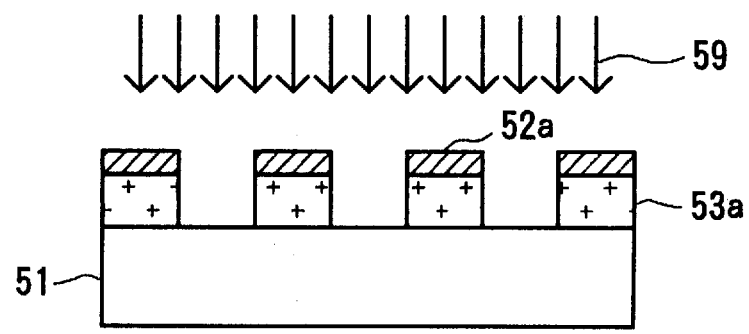

Next, as shown in step of FIG. 14C, the first resist layer 52 is developed by a photo-process, thereby leaving the exposed regions 52a of the first resist layer 52 and removing the unexposed regions of the first resist layer 52, and a resist pattern 52a is thus produced. This first resist pattern 52a has very thin film thickness, and is exposed uniformly in the depth direction so that a sharply defined pattern to duplicate the proximity pattern is produced. As mentioned above, because the second resist layer 53 has been heat treated during the process of exposure-masking, it is not affected during the development process of first resist layer 52. Next, as shown in step of FIG. 14D, FAB 59 is radiated through the resist-mask 52a to etch the thick second resist layer 53. Fast atomic beam may be produced from gases such as $SF_6$, $CHF_3$, to etch the structure. The material of the first resist pattern 52a is difficult to be etched while the material of the second resist layer 53 is easily etched, so that the thick resist material 53 is partially etched away. Fast atomic beam is made of electrically neutral particles, such that charge repulsive force is ineffective to generate highly linear beams. Also, there is no charge accumulation on electrically insulating materials, only vertical etching is performed and no horizontal dispersion occurs. For this reason, it is possible to produce a high aspect ratio through the thick second resist layer 53 using the thin resist pattern 52a as the etch-masking.

Figure 14E:
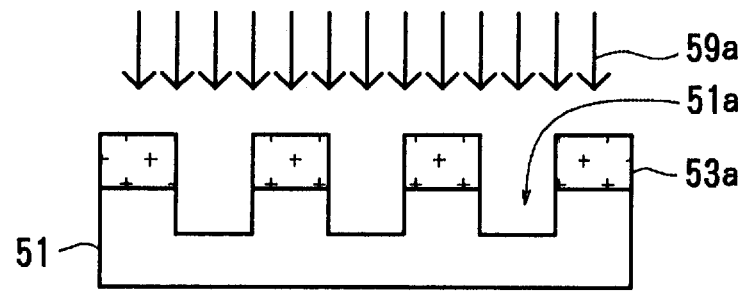

Next, as shown in step of FIG. 14E, FAB 59a is radiated to etch the base 51 using the resist pattern 53a formed by using the second resist layer 53 as the etch-masking. The FAB used in this step is chosen from a gaseous species so that the etching speed is high against the etching object, base 51, and is slow against the resist pattern 53a. Thus, the two processes can be performed concurrently, in which the resist pattern 53a is hardly etched while the unshielded base 51 is etched.

The properties of the FAB have been described earlier, so that etching proceeds in the depth direction while the lateral direction is hardly etched to easily produce micro-patterns of high aspect ratios in the base 51. When the pattern of several tens of nanometers in the first resist layer 52 is imprinted through the evanescent field, the same pattern widths are maintained for the thick resist pattern 53a while the same pattern width is maintained for the groove pattern 51a on the base 51.

FIGS. 15A through 15F show a variation of the method shown in FIGS. 14A through 14E, and the structure on the base is a three layer structure. The first photo-resist film 52 is photo-sensitive and has a thickness of several tens of nanometers, the second resist film 53 is not photo-sensitive and has a thickness of 500 nm, and the third resist film 54 is made of a metal thin film such as Cr, Ni, Al and has a thickness of 100 nm. The base 51 may be Si, GaAs or $SiO_2$ as mentioned earlier. Using an exposure-mask 56 having a proximity pattern 55, the top resist layer 52 is exposed through the evanescent fields, as shown in step of FIG. 15B. The top resist layer 52 is sub-wavelength thickness and preferably about the same thickness as the minimum dimension of the pattern 55, therefore sharp exposure can be obtained.

Figure 15A:
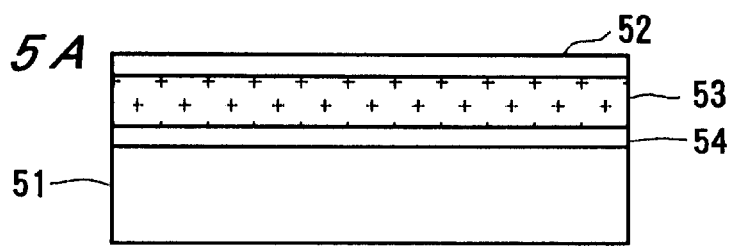
FIGS. 15A~15F are illustrations of the steps for a variation of the method shown in FIGS. 14A~14E.
Figure 15B:
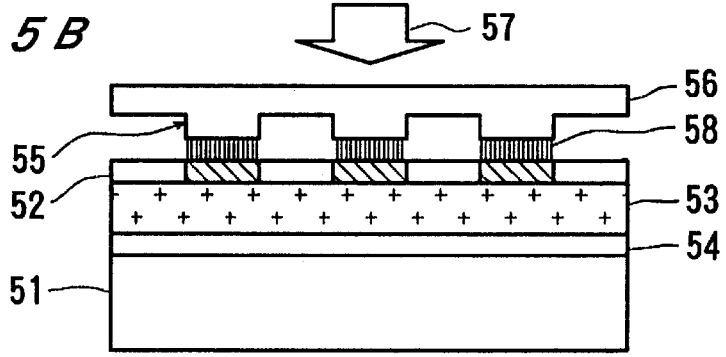
Figure 15C:
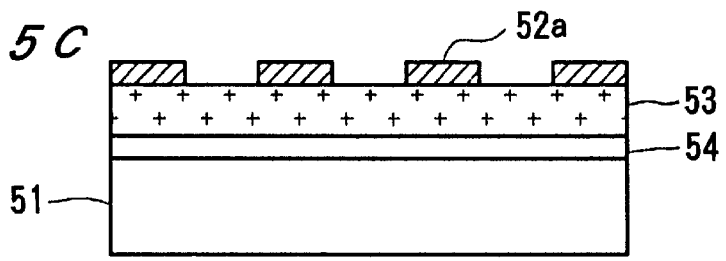
Figure 15D:
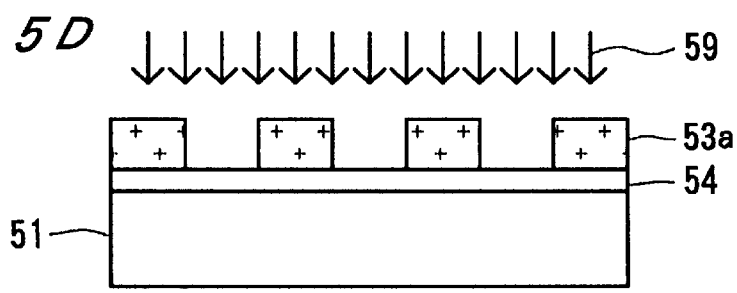
Figure 15E:
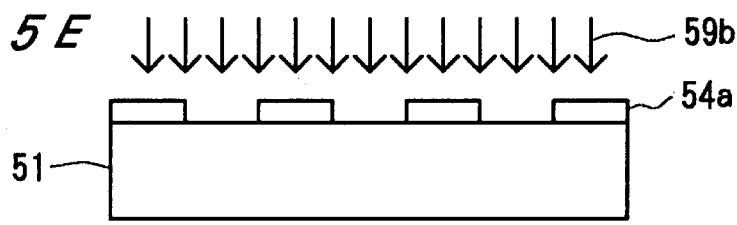

As shown in step of FIG. 15C, the first resist pattern 52a is developed photo-lithographically. Next, as shown in step of FIG. 15D, FAB 59, is chosen from gaseous species to carry out etching of the second resist film 53 so that etching is slow against the first resist pattern 52a but fast against the second resist film 53. Gaseous $SF_6$ is suitable for the FAB. Next, as shown in step of FIG. 15E, using the second resist pattern 53a as the etch-mask, the metal film 54 is etched. FAB 59b in this case also acts slowly against the resist pattern 53a but fast against the metal film 54. Gaseous $Cl_2$ is suitable for the FAB.

Figure 15F:
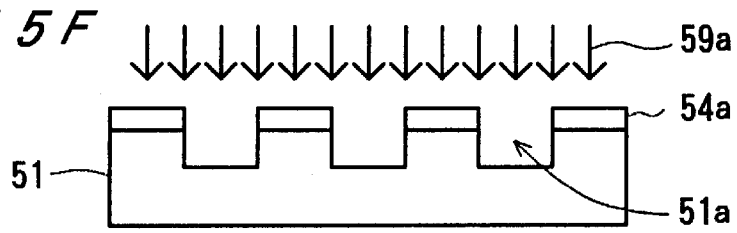

As shown in step of FIG. 15F, using the metal pattern 54a as the etch-mask, the base51 is etched. This etching can be performed as above by FAB 59a or by a gas plasma. Because a highly etch-resistant film such as the metal film 54a is used for protecting the base 51, therefore, even higher aspect ratios can be fabricated on the base 51.

FIGS. 16A through 16F show a variation related to a method of the evanescent-field-assisted imprinting. In this method, resist pattern fabrication and liftoff method are combined. As shown in step of FIG. 16A, a base 51 such as GaAs, Si, $SiO_2$ or glass substrate is prepared, and a thin photo-resist film 52 of 30~50 nm is coated. As shown in step of FIG. 16B, an exposure-mask 56 having a proximity pattern 55 is placed in contact or in proximity at a sub-wavelength distance with the resist film 52. By radiating a light from the back of the mask 56, evanescent fields 58 are produced between the pattern 55 and the resist film 52, which is selectively exposed according to the micro pattern 55. As before mentioned, because the resist thickness of the film 52 is about the same as the minimum dimension of the proximity pattern, very sharp image of the pattern 55 is produced.

Figure 16A:
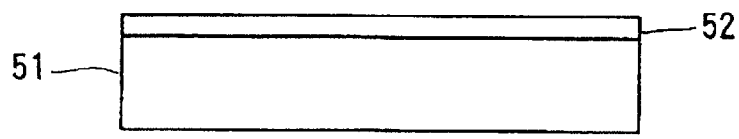
FIGS. 16A~16F are illustrations of the steps for another variation of the method in FIGS. 14A~14E.
Figure 16B:
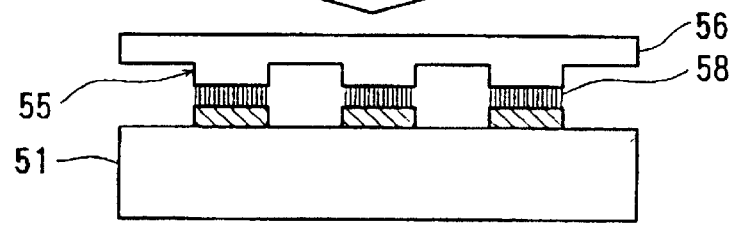
Figure 16C:
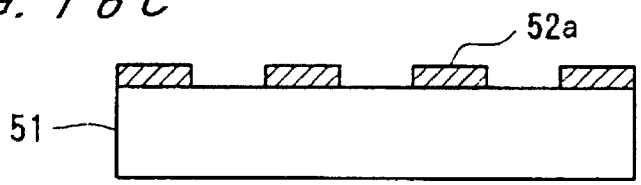
Figure 16D:
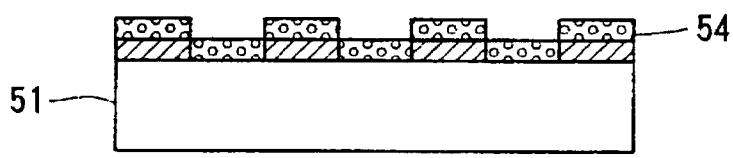

As shown in step of FIG. 16C, unexposed regions of the resist film 52 are removed to form a resist pattern 52a. After rinsing and post baking, a metal film 54 is deposited as shown in step of FIG. 16D. The metal film may be Cr, Al, Ni or W, and 30~50 nm thickness is suitable. Metal film is generally produced by vapor deposition but electroplating, sputtering, CVD or MBE can also be used.

Figure 16E:
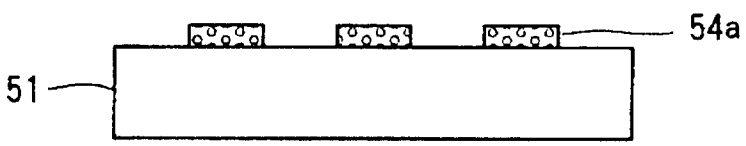
Figure 16F:
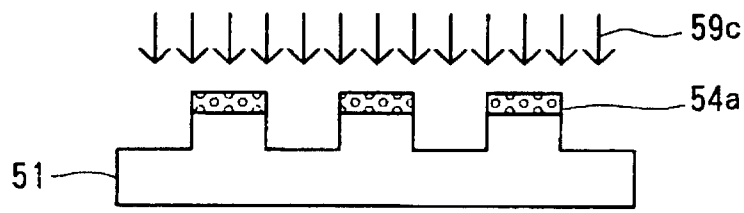

As shown in step of FIG. 16E, the resist pattern 52a is dissolved, then the metal film on the pattern 52a is also lifted off to leave behind a metal film pattern 54a on the base 51. As shown in step of FIG. 16F, a gas-based FAB 59c of slow etching speed against the metal pattern 54a and fast etching speed against the base material is chosen to perform etching. The gas may be a mixture of $Cl_2$, $SF_6$, $CHF_3$ and Ar. This procedure allows slow etching of metal film pattern 54a and fast etching on semiconductor material of the base 51, and high aspect ratios can be produced using the FAB that is highly linearly radiated.

In this embodiment, also, exposure is performed through the evanescent field on the thin resist film to produce sharp exposure, and the liftoff effect is used to imprint the resist pattern on the metal film, and used to protect from FAB so as to perform deep etching on the base, thereby imprinting fine patterns of sub-wavelength dimensions through the evanescent field to produce structures of high aspect ratio on the substrate such as silicon.

In the foregoing embodiments, on top of the thin resist film for evanescent field exposure, a thermo-hardening material (thermosetting polymeric resins) may be coated thinly. This improves etching resistance against FAB for resist pattern after photo-lithographic development, and improves selective etching.

Micro-patterns can be produced not only on Si, GaAs, $SiO_2$ but other materials such as ceramics, glasses, alloys.

Also, the thin protective film for the base material is not limited to the photo-resist or metal film, and other various resins or inorganic material can be used, if the substance has imprinting ability and etching resistance.

The present invention allows fabrication of micro-patterns of high aspect ratios and of sub-wavelength dimensions on a substrate.

FIGS. 17A through 17D show an embodiment related to a method of making an exposure-mask for the evanescent-field-assisted imprinting apparatus.

Figure 17A:
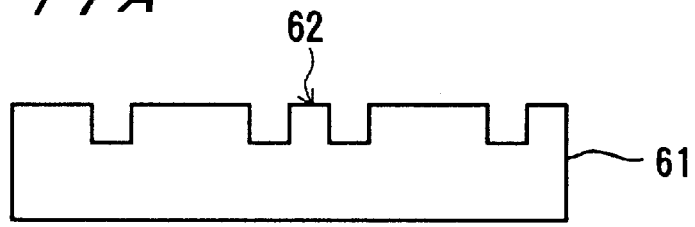
FIGS. 17A~17D are illustration of the steps for making a photo-mask in an embodiment.
Figure 17B:
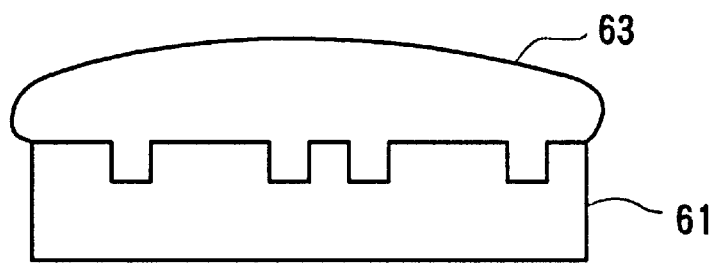
Figure 17C:
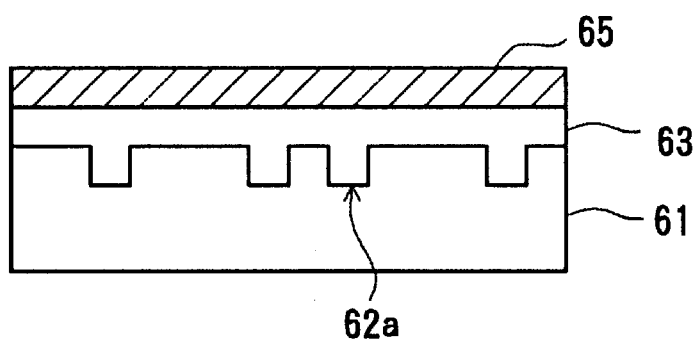
Figure 17D:
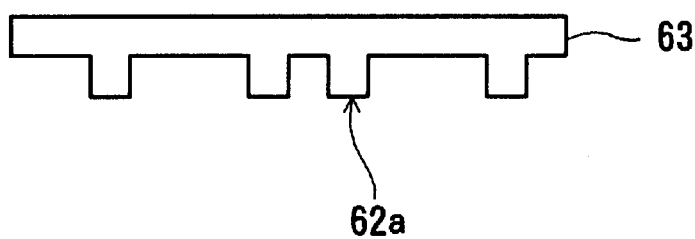

As shown in step of FIG. 17A, a mother mold 61 having micro-patterns of sub-wavelength dimensions is prepared. The mother mold 61 is made by metal material. A light transmissive mask material 63 is heated to be molten liquid and poured into a mold 61, as shown in step of FIG. 17B. The material 63 is such as glasses, resins (PMMA), or plastics. Next, as shown in step of FIG. 17C, a press 65 is used to press the mask material 63. In this step, the molten liquid of the mask material 63 infiltrates into the micro-patterns of the mother mold and after cooling in the mold, a proximity pattern 62 of the mother mold 61 is accurately reproduced. As shown in step of FIG. 17D, the cooled masking material 63 is separated from the mother mold 61 to produce an exposure-mask 63 having a proximity pattern 62a. Separation of the mask 63 from the mother mold 61 is easily carried out because the metal mold and polymeric duplication material have different thermal expansion properties, and the duplication material is poured in hot and molten state, and is separated after the mold has been cooled and the mask 63 has been cooled to be solid.

FIGS. 18A through 18D show an embodiment related to making a mother mold. As shown in step of FIG. 18A, a photo-resist film 67 is coated on a metal material 61a. The metal material 61a may be stainless steel (Ns-P/SUS). Next, as shown in step of FIG. 18B, direct electron beam exposure is carried out to produce an exposed pattern 67a. Electron beam is free from wavelength limitation of optical light, so that micro-patterns of sub-wavelength dimensions can be easily produced. Next, as shown in step of FIG. 18C, the surface is developed photo-lithographically, and exposed regions 67a of the resist film 67 are removed to produce a resist film pattern 67b. The resist film pattern 67b is a proximity pattern directly formed by the electron beam.

Figure 18A:
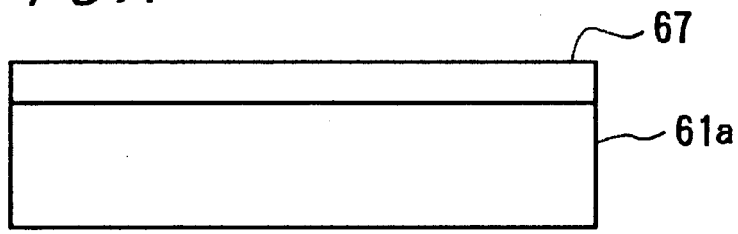
FIGS. 18A~18D are illustrations of the steps for making a mother mold in an embodiment.
Figure 18B:
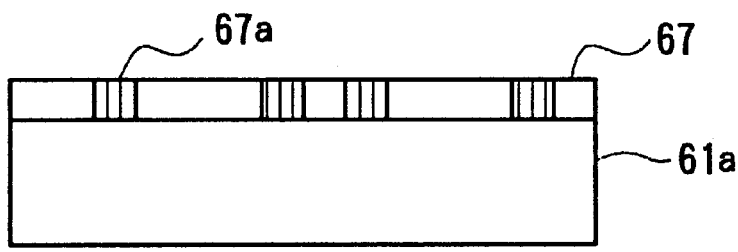
Figure 18C:
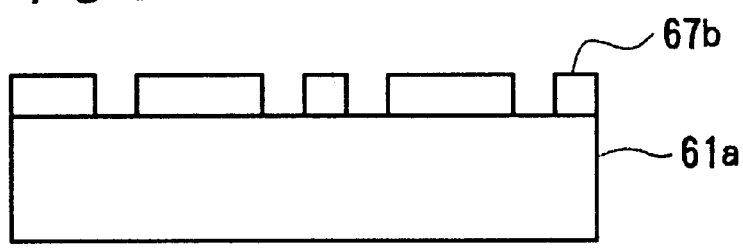
Figure 18D:
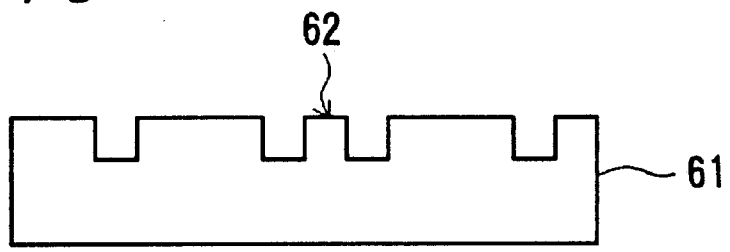

Next, after rinsing and post baking to increase tolerability of the resist film pattern 67b, and as shown in step of FIG. 18D, using the resist film pattern 67b as an exposure-mask, the metal base 61 is fabricated by etching. The etching fabrication is most suitably carried out by FAB. Particularly, a parallel plates FAB source can generate highly linear beam and free from beam dispersion caused by charge accumulation so that etching fabrication of high aspect ratios can be carried out on the metal base 61 using the exposure-mask made of the resist film pattern 67b. This process thus produces a mother mold 61 of a metal material having a proximity pattern 62.

FIGS. 19A through 19E show an embodiment related to a method of making the duplication mask having the proximity pattern. A metal mother mold 61 having an original proximity pattern 62 is coated with a soluble thin film 66. The thin film is water soluble, and is used to separate the mask from the mold 61. And, as shown in step of FIG. 19B, a molten transmissive mask material 63 is heated to be molten state, and poured into the mold 61, and as shown in step of FIG. 19C, a roller 68 is used to press the mask material 63 to infiltrate to all the corners of the pattern 62. The mold is cooled after then, and an imprinting pattern 62a of the original proximity pattern 62 is formed on the duplication mask material 63.

Figure 19A:
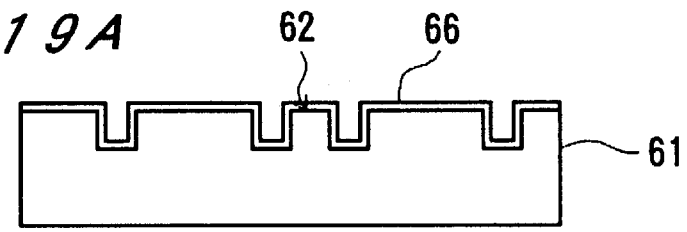
FIGS. 19A~19E are illustrations of the steps for making a duplicated mask in an embodiment.
Figure 19B:
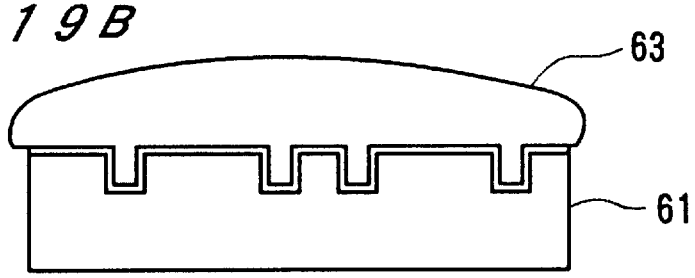
Figure 19C:
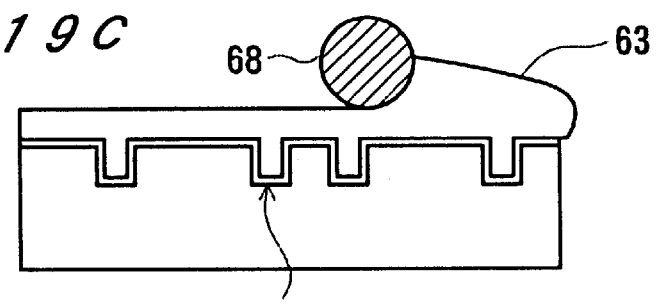
Figure 19D:
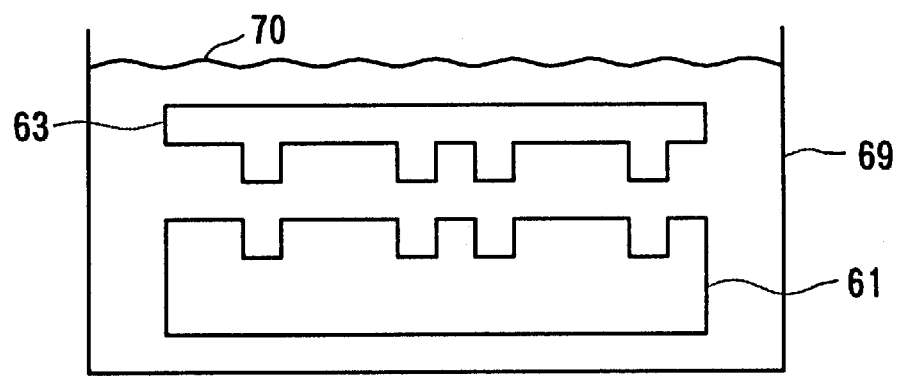
Figure 19E:
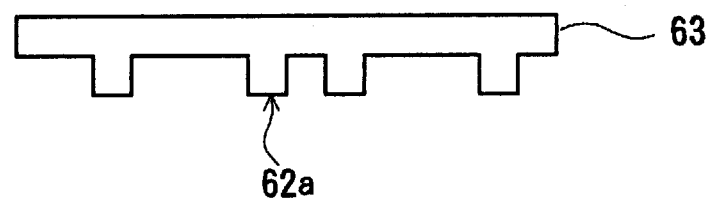

Next, as shown in step of FIG. 19D, it is immersed in water 70 in a container 69, the soluble film 66 is dissolved in water 70 so that the duplication mask 63 having proximity pattern 62a is separated from the mother mold 61. And, as shown in step of FIG. 19E, a duplication proximity pattern 63 having the proximity pattern 62a is produced.

FIGS. 20A through 20E show a variation related to a method of making the mother mold. First, a base 72 of Si is prepared to have a thin film of $SiO_2$ 73 formed thereon, which has a thickness of 0.1~5 μm. A resist film 74 is coated on the film 73 to a thickness of 10~100 nm. And, as shown in step of FIG. 20A, direct electron beam exposure is performed to form a proximity pattern. Different than optical light, electron beam is not subject to diffraction effects, so that micro-patterns of sub-wavelength dimensions, less than 100 nm, can be produced by exposing with an electron beam. Exposed regions 74a of the resist film 74 are removed by photographic processing, and a proximity pattern 74b made of the resist film is produced. After rinsing and post baking to improve tolerability of the resist film, using the resist film pattern 74b as the exposure-mask, FAB is radiated to etch the $SiO_2$ film. This process produces a proximity pattern 73a imprinted on the $SiO_2$ film 73. Particularly, a parallel plates FAB source generates highly linear beam and free from beam dispersion caused by charge accumulation so that etching fabrication of high aspect ratios can be carried out on the $SiO_2$ film using the exposure-mask made of the resist film pattern 74b to produce a proximity pattern 73a.

Figure 20A:
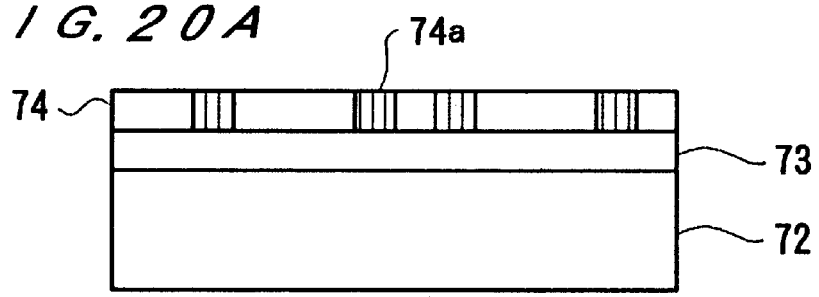
FIGS. 20A~20E are illustrations of the steps for making a mother mold in a variation.
Figure 20B:
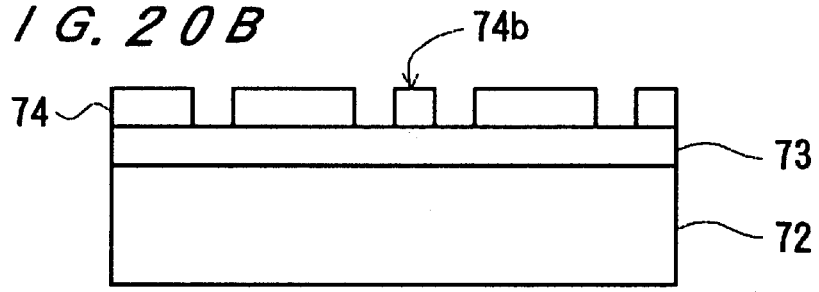
Figure 20C:
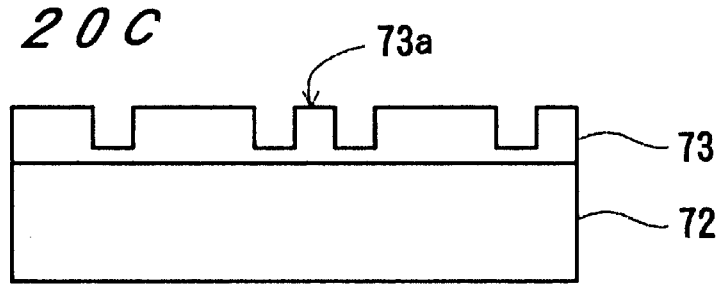
Figure 20D:
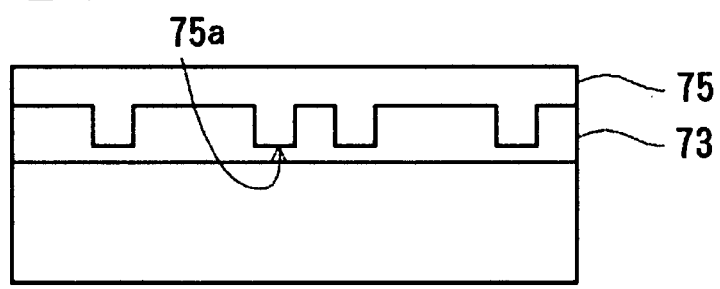
Figure 20E:
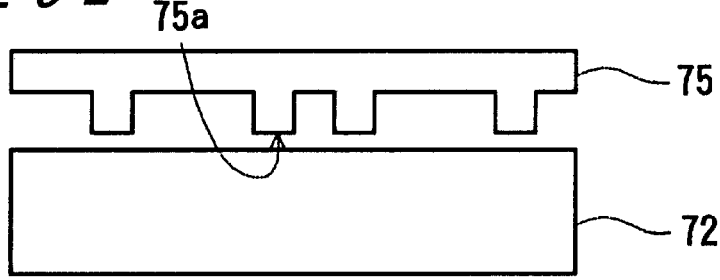

Next, as shown in step of FIG. 20D, a metal film 75 such as Cr, Al, Ag, W, Mo is produced by sputtering, CVD, MBE, or vapor deposition technique. Because the process used is a vapor phase process, the groove patterns 73a are filled accurately with the metal film to reproduce the fine pattern 75a made of a metal film 75 accurately. And, as shown in step of FIG. 20E, $SiO_2$ film 73 is dissolved in HF solution to separate the metal film 75 from the base 72. The metal film 75 has the proximity pattern 75a aimprinted on, so that the metal film can be used as mother mold for mass production. Also, instead of themetal film 75, glasses, resins such as polyimide, plastics can be used with sputtering, vapordeposition or CVD. In addition to vapor deposition methods such as sputtering, molten material may be coated. In any case, by removing the $SiO_2$ film, a mother mold having a proximity pattern imprinted on such materials can be produced.

The mother mold can be used to mass produce exposure-mask by a method such as FIGS. 17A~17D or 19A~19E, and mass produced mask can be applied for the imprinting technique of evanescent-field assisted exposure to produce micro-patterns of sub-wavelength dimensions on LSI devices, and so on. The duplication masks are easily mass-produced and production cost become lower, and can be used as disposal goods.

In manufacturing of duplication mask having proximity pattern, the technique to use a semi-molten $SiO_2$ material to be polymerized on a quartz glass or plastic surface may be used, and this molten $SiO_2$ material is pressed by a metal or other kind of mold having a proximity field exposure pattern so that the pattern transfer may occur in a semi-molten state of the material. After this the $SiO_2$ material is polymerized and the mother mold is removed. Various material may be used to produce mother mold and mass produced exposure-mask, so that particular advantages may be offered by each material.

As explained above, duplication exposure-mask having the proximity field exposure pattern can be readily produced using the various techniques disclosed above. Thus, photo-lithographic technique can be applied in conjunction with the evanescent-field assisted imprinting of micro-patterns using a mass-produced proximity patterns to imprint micro-pattern even on LSI devices.

FIGS. 21A through 21D show an embodiment related to a method of imprinting micro-pattern of a template for an object. As shown in step of FIG. 21A, an imprint template 111 having a micro-pattern 112 of sub-wavelength dimensions of the exposure light is prepared. The imprint template 111 may be made of a metal, and the micro-pattern is comprised by line widths and depths of several tens of nanometers, for example. However, the line widths and depth may be larger than wave length of the light. The imprint base 113 on which the micro pattern of the template 111 is imprinted, has a resist film 115 coated on the surface thereon. The imprint base 113 may include metals such as Al, Ni, Ag, Au, W, Mo, SUS, yellow brass, or an inorganic material such as Si, $SiO_2$, Ni—P, DLC (diamond likecarbon), glasses, quartz glass, a resin material such as plastics, F-containing polymers, polyimide, PMMA.

Figure 21A:
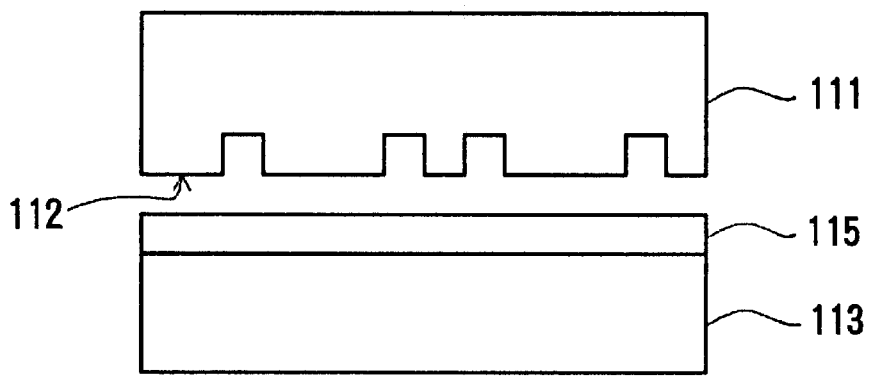
FIGS. 21A~21D are illustrations of the steps for a method of micro-pattern imprinting in an embodiment.
Figure 21B:
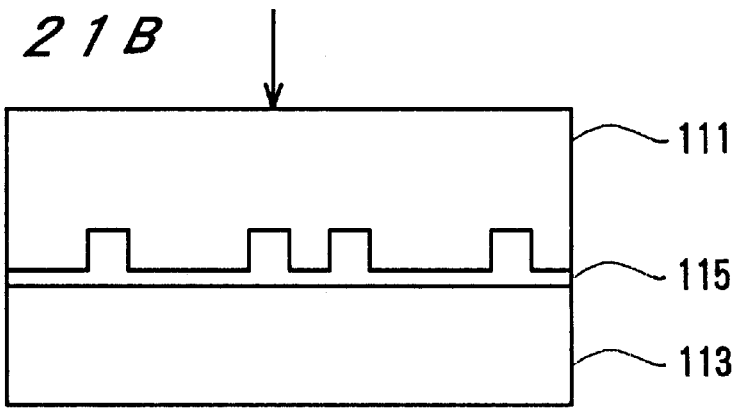

As shown in step of FIG. 21B, the micro-pattern 112 on the imprint template 111 is made to contact the resist film 115 coated on the imprint base 113 and is pressed. This process forms a duplicated pattern of the micro-pattern 112 on the resist film 115. Imprinting on a polymeric material such as resist film is affected by its hardness, for example, if the viscosity is too low, imprinted shape is brittle, and if it is too high, the corners are rounded so that high aspect ratios are difficult to be achieved. Proper control is important in micro-pattern production.

Figure 21C:
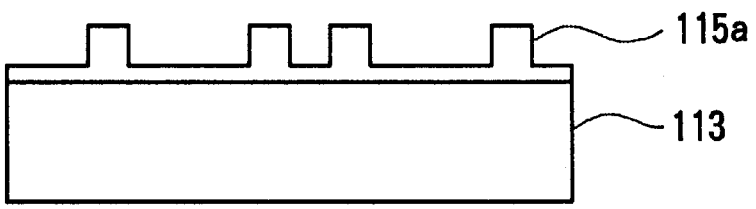
Figure 21D:
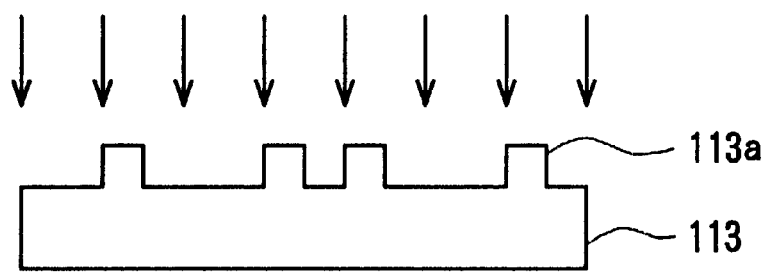
Figure 22A:
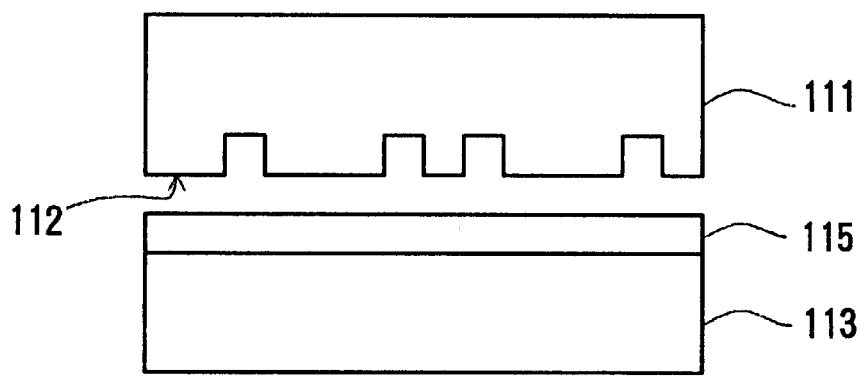
FIGS. 22A~22D are illustrations of a variation of the method shown in FIGS. 21A~21D.
Figure 22B:
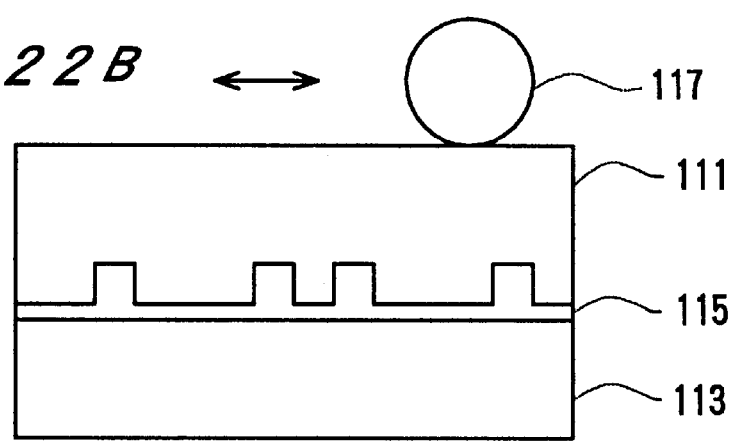
Figure 22C:
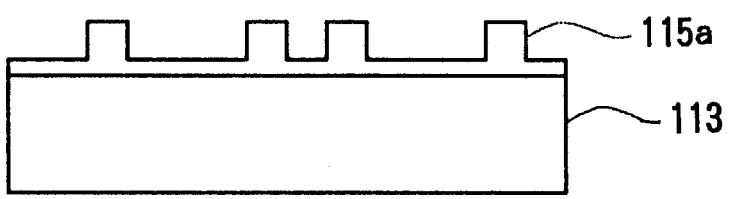
Figure 22D:
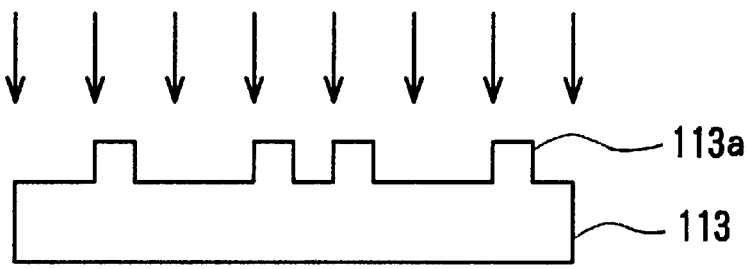

The state of the imprint template 111 after the removal of photo-resist film 115 is shown in step of FIG. 21C. After post baking and others, tolerability of the resist film is improved. And, as shown in step of FIG. 21D, FAB irradiation is performed. FAB is an electrically neutral beam, and in particular, parallel plate type FAB has a characteristic of high beam linearity of the etching beam so that the imprint base 113 can be etched to a high aspect ratio.

FIGS. 22A through 22D show a variation of the technique. In this case, the imprint base 113 is pressed by a roller 117. This technique can overcome high/low structures or curved structures of the imprint base. Other steps are the same as those shown in FIGS. 21A through 21D.

Figure 23A:
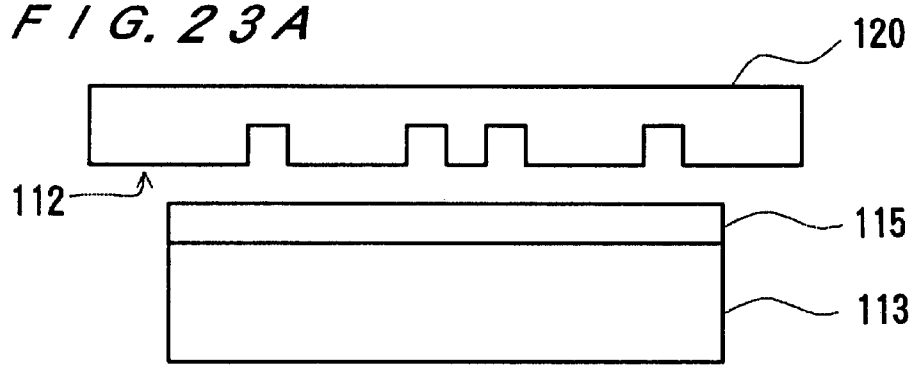
FIGS. 23A~23D are illustrations of a variation of the method shown in FIGS. 21A~21D.
Figure 23B:
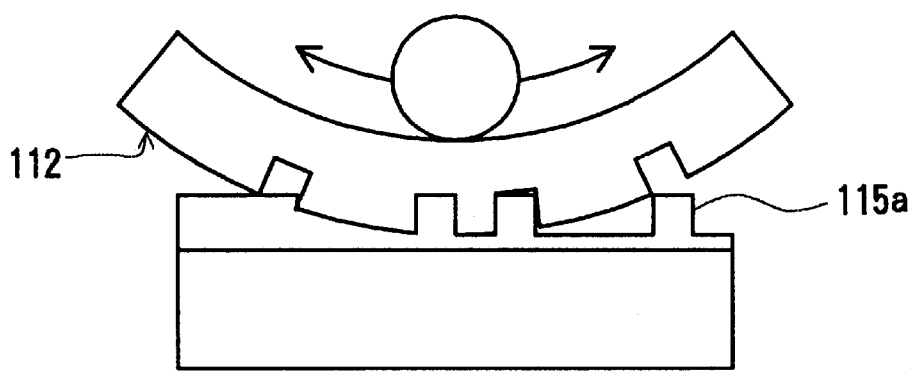
Figure 23C:
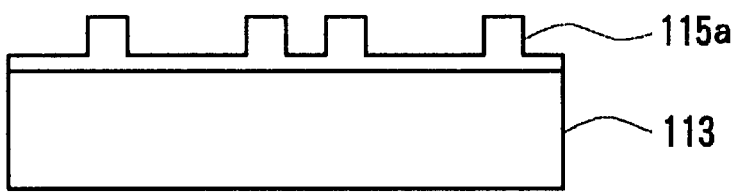
Figure 23D:
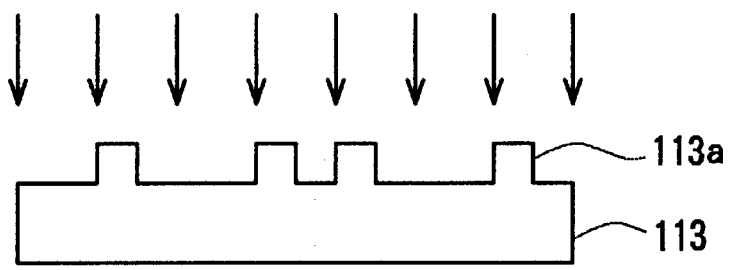

FIGS. 23A through 23D show another variation of micro-pattern imprinting. In this case, the template 120 is a flexible material. As shown in step of FIG. 23A, the imprint base 113 is coated with a resist film 115, which is facing separated from the micro-pattern 112 on the template 120. As shown in step of FIG. 23B, a roller 117 is used to press on the template 120 to transfer the micro-pattern 112 on the template 120 to the resist film 115 on the base 113. This is used as exposure-mask for FAB irradiation to etch the imprint base 113, and as shown in FIG. 23D, a micro-pattern 113a is formed on the imprint base 113 as in the foregoing embodiment. In this embodiment, flexibility of template 120 is an advantage so that even if the imprint base 113 is curved, micro-pattern 112 can be imprinted.

Figure 24A:
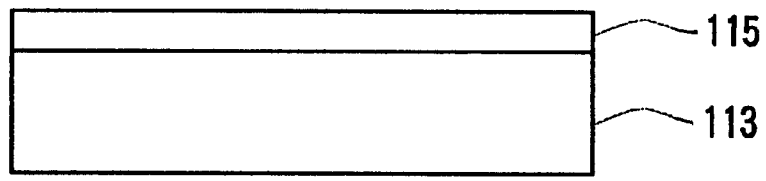
FIGS. 24A~24D are illustrations of a variation of the method shown in FIGS. 21A~21D.
Figure 24B:
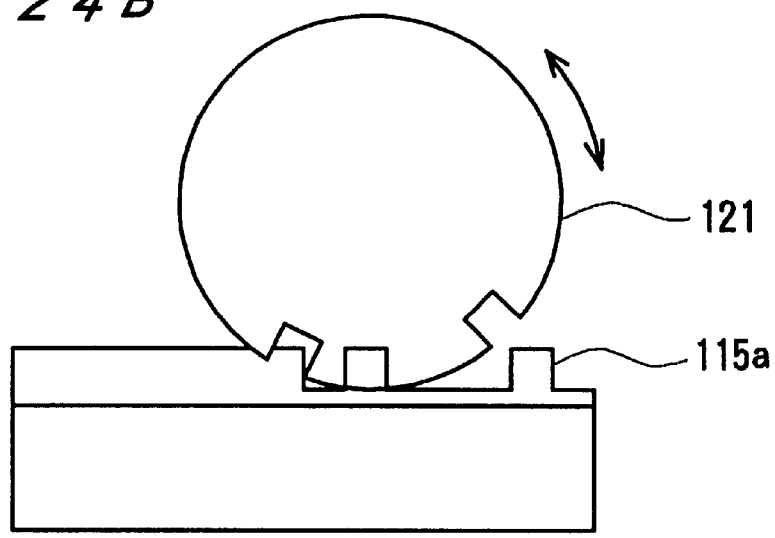
Figure 24C:
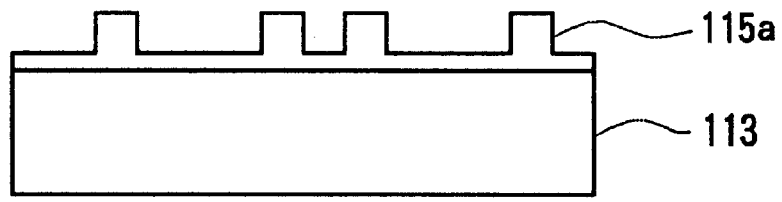
Figure 24D:
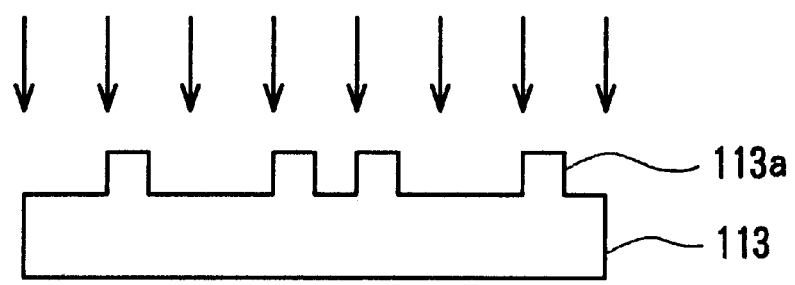

FIGS. 24A through 24D show another variation of a method for micro pattern imprinting. A template 121 is a roller having the micro-pattern on its outer peripheral surface. As shown in step of FIG. 24A, an imprint base 113 is prepared by coating a resist film 115, and as shown in 24B, the roller 121 is pressed and rotated on the resist film 115 on the imprint base 113 to imprint the micro-pattern. Subsequent steps in FIGS. 24C, 24D are the same as those in foregoing embodiments. This technique is advantageous when the imprint base 113 has curvatures.

FIGS. 25A through 25D show another variation of a method for micro pattern imprinting.

Figure 25A:
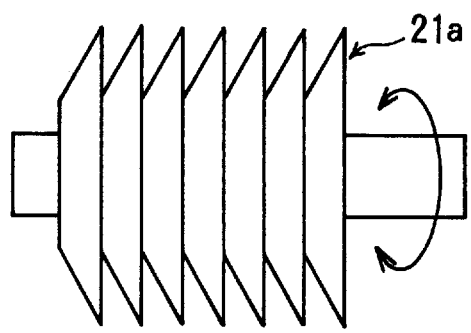
FIGS. 25A~25D are illustrations of a variation of the method shown in FIGS. 24A~24D.
Figure 25B:
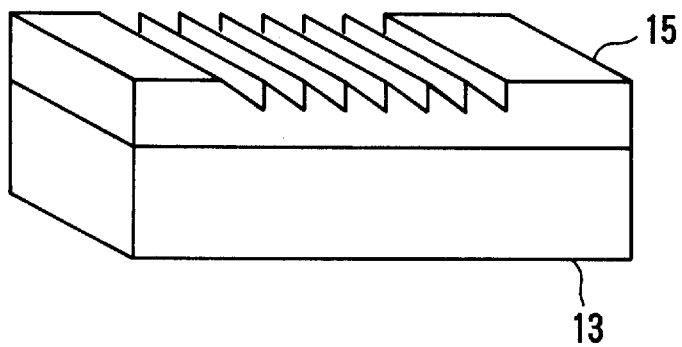
Figure 25C:
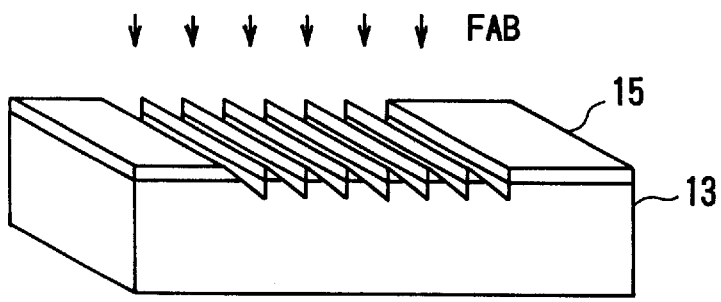
Figure 25D:
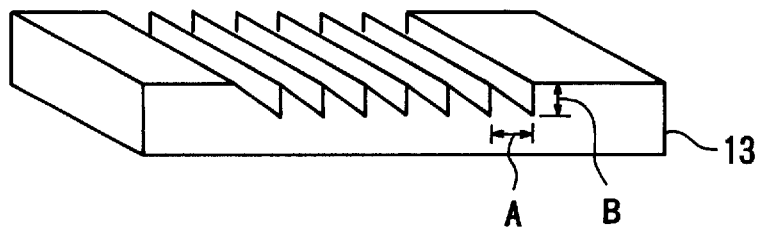
Figure 26A:
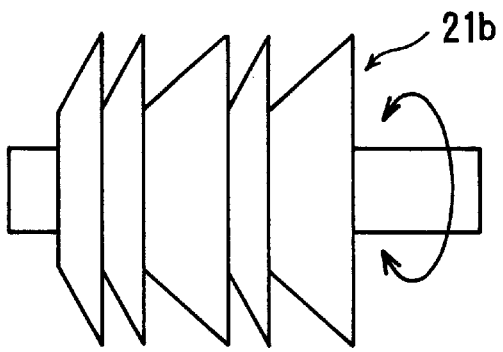
FIGS. 26A~26D are illustrations of a variation of the method shown in FIGS. 25A~25D.
Figure 26B:
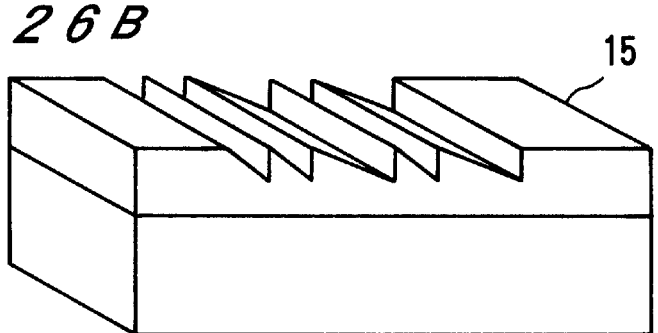
Figure 26C:
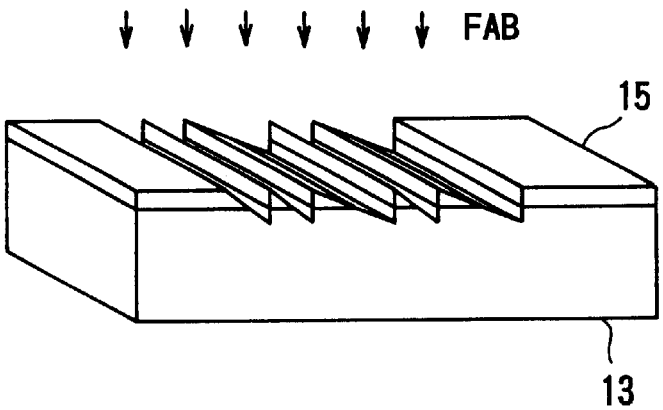
Figure 26D:
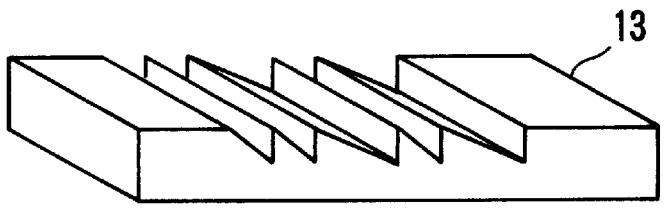
Figure 27A:
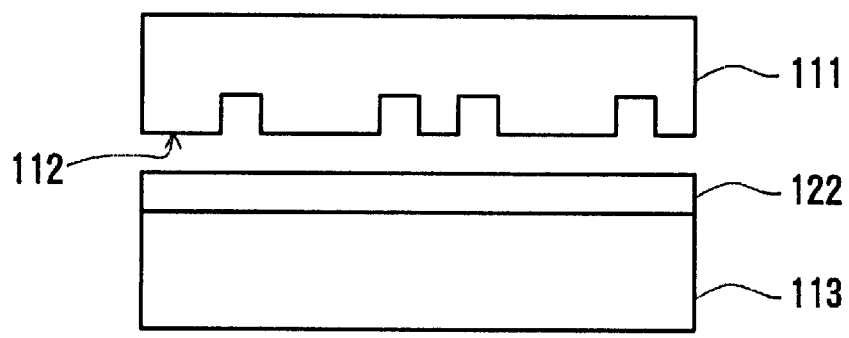
FIGS. 27A~27E are illustrations of the steps for a method of micro-pattern imprinting in a variation.
Figure 27B:
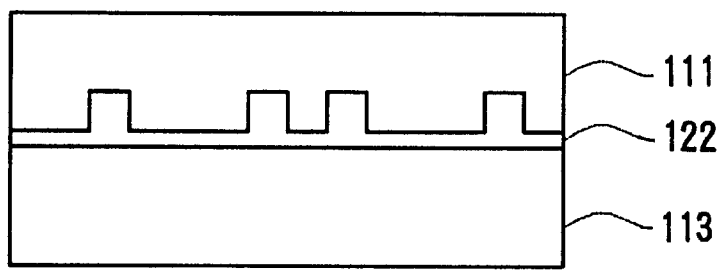
Figure 27C:
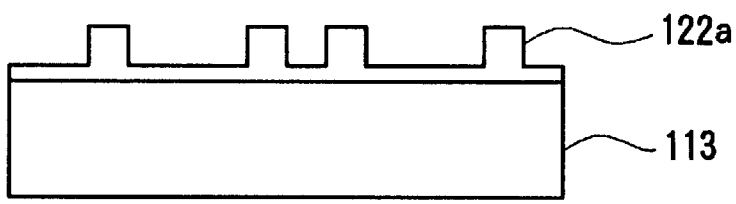
Figure 27D:
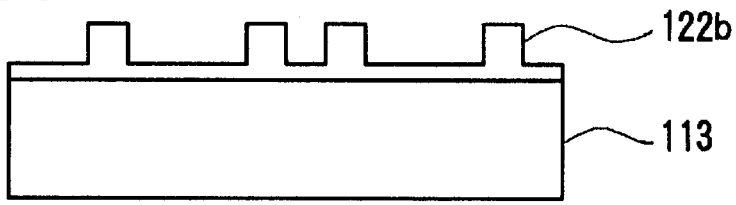
Figure 27E:
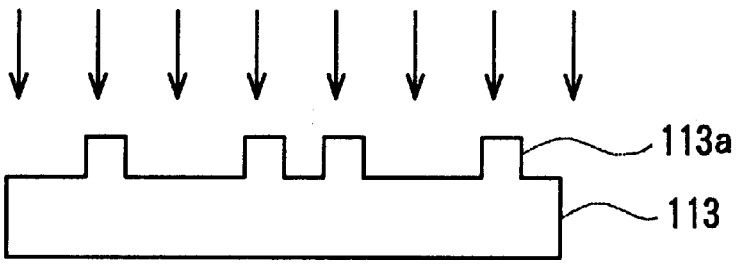

As shown in step of FIG. 25A, an imprint template is a roller 21a having micro-patterns in the axial direction. As in the above embodiment, an imprint base 13 with a resist coating 15 is prepared, in this case, the imprint base 13 is quartz glass. As shown in step of FIG. 25A, the micro-patterns are replicated on the resist-film 15 by using the roller 21a which is pressing and rotating thereon. And, as shown in step of FIG. 25C, FAB is used to fabricate for etching the resist film 15 and the imprint base 13 underneath. As shown in step of FIG. 25D, micro-patterns formed on the resist film 15 are imprinted on the imprint base 13.

In this case, spacing A and depth B of the micro-patterns can be fabricated to be about 0.1~100 µm. Micro-patterns fabricated on quartz glass can be used most suitably for making diffraction lens, pickup lens and Fresnel lens. Irradiation conditions for FAB are using $SF_6$ gas, discharge voltage 3 kv, discharge current 30~50 mA, beam diameter 80 mm, cooling temperature for substrate −30~50° C., and fabrication speeds of 100~300 Angstrohm/min can be produced. Micro-patterns of the roller may be made as a unit with the roller or may be prepared separately. Micro-patterns on the resist film may be replicated by using a constant pressure, which is given by the roller operated by any type of suitable jig.

FIGS. 26A through 26D show a variation of an embodiment shown in FIGS. 25A through 25D. As shown in step of FIG. 26A, the spacing of the micro-patterns fabricated in the axial direction on the roller 21b are varied, and as shown in step of FIG. 26D, micro-patterns of the roller 21b are replicated on the imprint base 13. Other than this difference, this embodiment is same as shown in FIGS. 25A through 25D. FIG. 27 shows an embodiment fifteen of a method of micro-pattern imprinting. In this case, instead of the resist film, polymerizable film 122 is used. As shown in step of FIG. 27A, an imprint template 111 having a micro-pattern 112 of sub-wavelength dimensions is prepared and a semi-solid polymerizable film ($SiO_2$) 122 is coated, and an imprint template 111 is pressed against the film 122. The imprint template 111 is separated to produce an imprinted pattern 122a as shown in step of FIG. 27C. This semi-solid polymer film 122 is heated to polymerize the film 122 to film 122b. It is important to control polymerization condition to prevent degradation in property due to improper heating. The polymerized film 122b can be fabricated by an energetic beam such as FAB, and can withstand FAB etching as shown in step of FIG. 27E to produce micro-patterns of high aspect ratios.

FIG. 28 shows sixteenth embodiment of a method of micro-pattern imprinting. As shown in step of FIG. 28A, a water soluble thin film 124 is coated on the surface of a resist film or polymer film 113. Thickness of the thin film is 10~50 nm, and is thinner compared with the thickness 10~100 nm of resist film or polymer film 113. And, as shown in step of FIG. 28B, the imprint template 111 is pressed against the resist film 113 to imprint the micro-pattern. And, as shown in step of FIG. 28C, it is immersed in water. The thin film 124 is dissolved in water, and the imprint template 111 can be separated easily from the resist pattern side to prevent damaging the pattern formed on the resist film is damaged. Step 28D is the same as the other foregoing embodiment.

FIG. 29 is a embodiment seventeen of a method of micro-pattern imprinting.

Figure 29A:
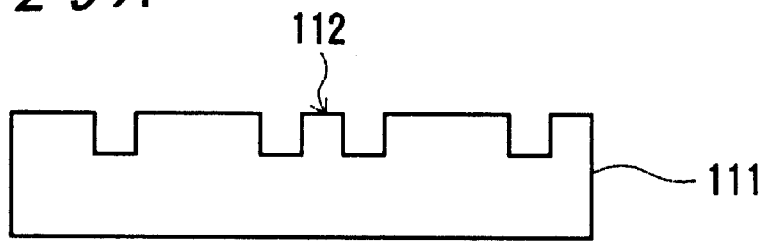
FIGS. 29A~29D are illustrations of the steps for a method of micro-pattern imprinting in a variation.
Figure 29B:
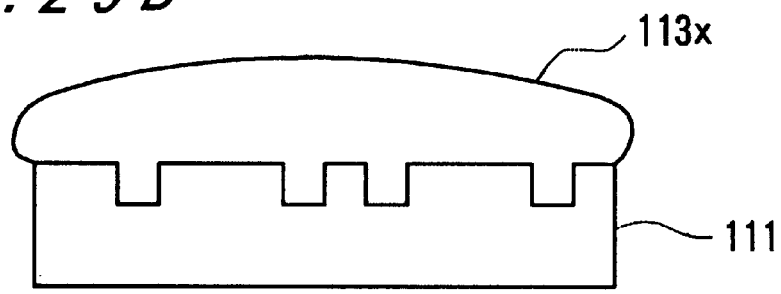
Figure 29C:
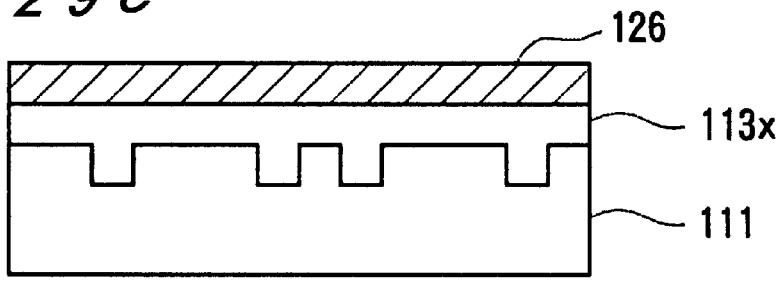

As shown in step of FIG. 29A, a metal template 111 having micro-patterns smaller than the wavelength is prepared. As shown in step of FIG. 29B, an imprinting material made of an imprinting material 113x such as glasses, resins (PMMA) and plastic material is poured in a molten state on an imprint template 111. Next, as shown in step of FIG. 29C, a press 126 is used to apply a pressure on the imprinting material 113x. The imprinting material fills the grooves in the pattern on the imprint template 111 and when it is cooled, a micro-pattern 112 is accurately imprinted to the imprinting material 113x.

Figure 29D:

Next, as shown in step of FIG. 29D, cooled material 113c is separated from the imprint template 111 to produce an imprinting material 113c having a micro-pattern completed. When separating, if the imprint template 111 is metallic and the imprinting material is glass or resin, thermal expansion coefficients are different, and especially because the imprinting material fills in a heated state and solidifies after cooling, separation is achieved easily.

FIGS. 30A through 30E shows an embodiment of a method of micro-pattern imprinting. A soluble film 128 is coated on a metallic template 111 having a micro-pattern 112. The soluble thin film 128 is water soluble and is used for separation purpose. As shown in step of FIG. 30B, heated and molten material 113x is poured into the metal template 111. Next, as shown in step of FIG. 30C, a roller 117 is used to press the molten material 113x into every corner of the micro-pattern 112. After cooling, an imprint pattern 113c of the solid micro-pattern 112 is formed on the imprint material 113x.

Figure 30A:
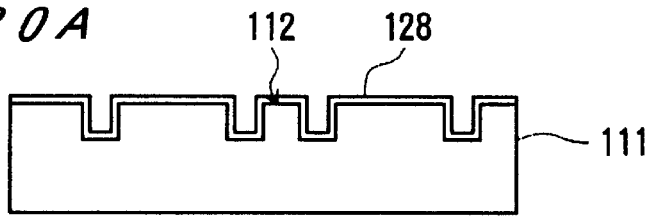
FIGS. 30A~30E are illustrations of the steps for a method of micro-pattern imprinting in a variation.
Figure 30B:
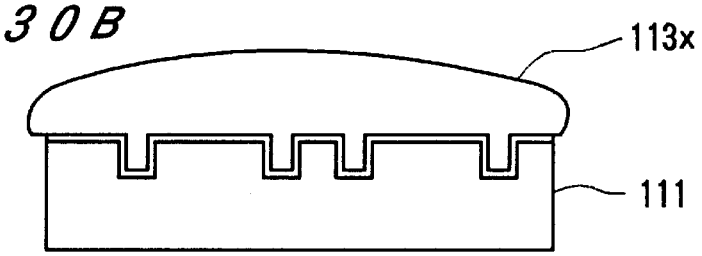
Figure 30C:
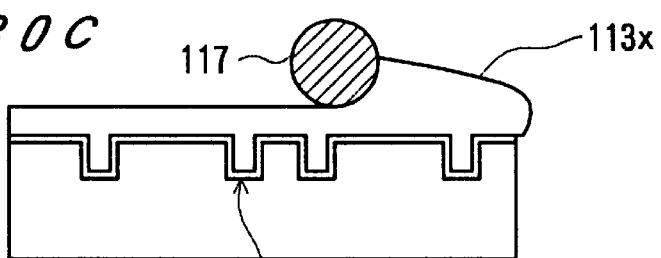
Figure 30D:
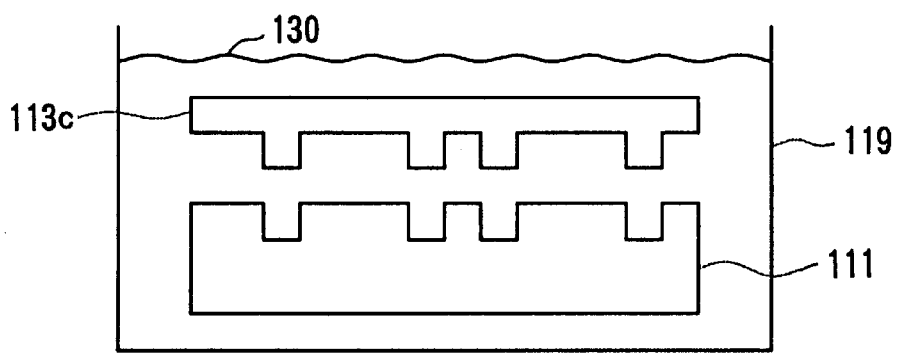
Figure 30E:

And, as shown in step of FIG. 30D, the imprint template 111 is immersed in water to dissolve the coating material 128 in water 130, and the imprint pattern 113c is separated from the template 111, and thereby making an imprint pattern 113c having the micro-pattern 112 imprinted from the imprint template 111.

FIGS. 31A through 31D are an embodiment related to a method for making templates. As shown in step of FIG. 31A, a metallic material 111 is coated with a resist film 131. Stainless steel (Ns-P/SUS) is suitable for the metallic material. Next, as shown in step of FIG. 31B, micro-pattern 131a is fabricated directly on the imprint material 111 using an electron beam. Electron beam direct exposure method is not affected wavelength limitation as is the optical light, micro-patterns of sub-wavelength dimensions can easily be fabricated directly. Next, as shown in step of FIG. 31C, the resist film 131 is photolithographically developed, and all material excepting the exposed section 131a is removed, thereby producing a resist pattern 131b formed directly by the electron beam.

Figure 31A:
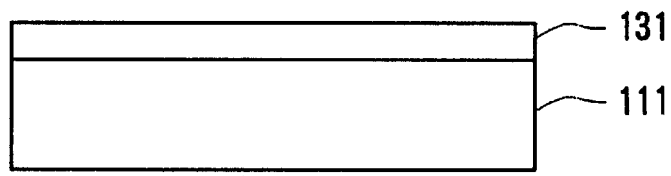
FIGS. 31A~31D are illustrations of the steps for a method of micro-pattern imprinting in a variation.
Figure 31B:
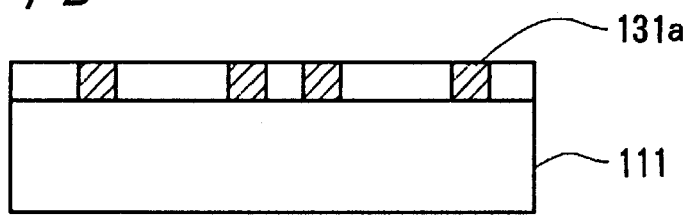
Figure 31C:
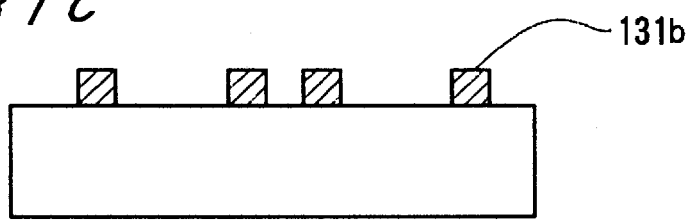
Figure 31D:
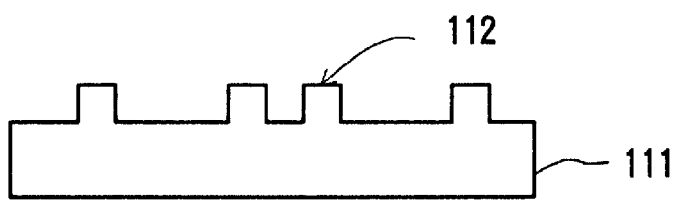

Next, rinsing and post baking are applied to improve tolerability of the resist pattern 131b, and next, as shown in FIG. 31D, resist pattern 131b is used as an exposure-mask to etch the metallic material 111, using FAB, and in particular, parallel plate type FAB has high beam linearity of the etching beam and no dispersion caused by accumulated static charge, so that an imprint template 111 having micro-patterns with high aspect ratios can be produced using an exposure-mask 131b.

Above example is only one case, and instead of electron beam, X-ray beam can also be used. Instead of FAB, plasma etching may also be applied. The material for template may be a silicon, ceramic or resin material instead of a metallic material.

As described above, the technique of fabricating LSI of sub-wavelength line width and spacing (0.1 $\mu$m or less) is not yet established, and even the resist pattern making is difficult in some cases. Normal optical photolithography processes are limited by the wavelength effect of the exposure light. Electron beam exposure technique has no wavelength restrictions, but the scribing method is not suitable for mass production, resulting in high cost. Although the X-ray exposure method is similarly not limited by the wavelength effect, and high precision pattern making is fundamentally possible, but in practice, there are many problems, and it is difficult to be incorporated into a practical production line. With respect to etching fabrication, plasma method suffers from poor directionality of the energetic particle beam, and because the resist materials are poor conductors, which leads to non-uniform distribution of electrons and consequently to poor fabrication.

FIGS. 32A through 32D show an embodiment related to a method of making LSI devices. This method uses a template having micro-patterns of sub-wavelength dimensions and imprint the pattern directly on a resist surface coated on a semiconductor wafer. As shown in step of FIG. 32A, a template 19 having micro-patterns of sub-wavelength dimensions is prepared. This template 19 is made of a metal, and the micro-pattern includes structures having depths and widths in a range of several tens of nanometers. An imprint base 15 is coated with a resist film 16. The template 19 may include metals such as Al, Ni, Ag, Au, W, Mo, SUS, yellow brass, or an inorganic material such as Si, $SiO_2$, Ni—P, DLC (diamond like carbon), glasses, quartz glass, a resin material such as plastics, F-containing polymers, polyimide, PMMA. Photo-resist may be replaced with a polymerizable semi-solid material that can imprint exposure-structures by being in contact with the template and produces tolerability for etch-mask by thermal treatments.

Figure 32A:
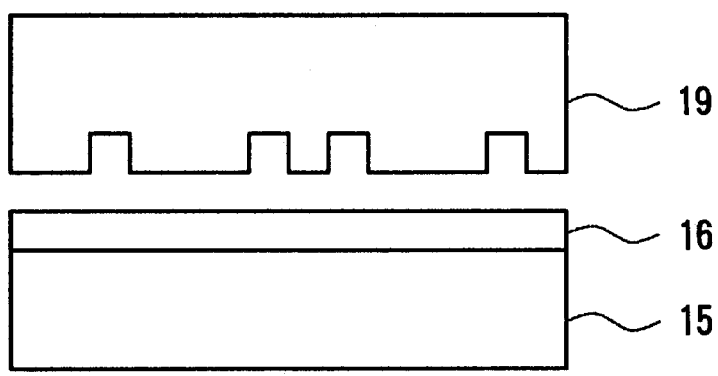
FIGS. 32A~32D are illustrations of the steps for a method of micro-pattern imprinting in a variation.
Figure 32B:
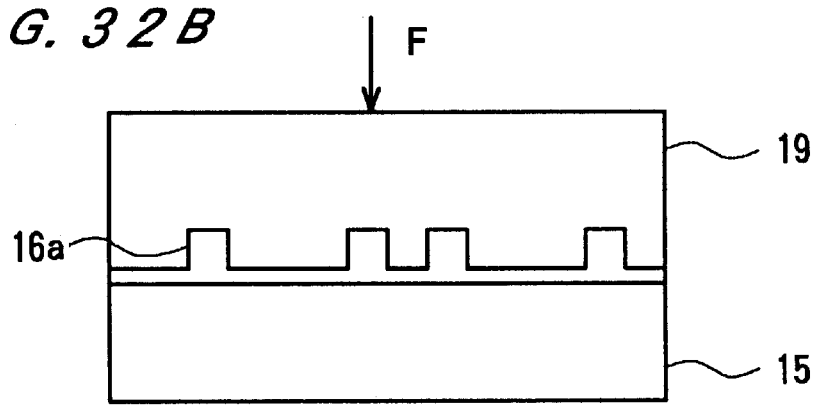
Figure 32C:
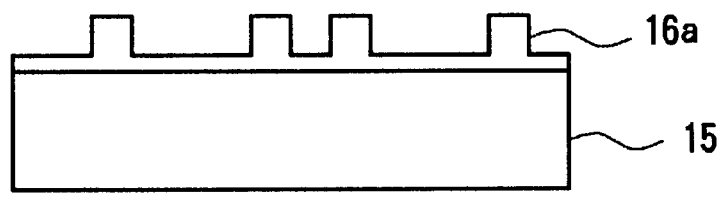

And, as shown in step of FIG. 32B, the pattern on the template 19 is made to contact the resist film 16 on the imprint base 15 and pressed to produce an imprinted pattern 16a on the resist film. Imprinting on a polymeric material such as resist film is affected by its hardness, for example, if the viscosity is too low, imprinted shape is brittle, and if it is too high, the corners are rounded so that high aspect ratios are difficult to be achieved. Proper control is important in micro-pattern production.

Figure 32D:
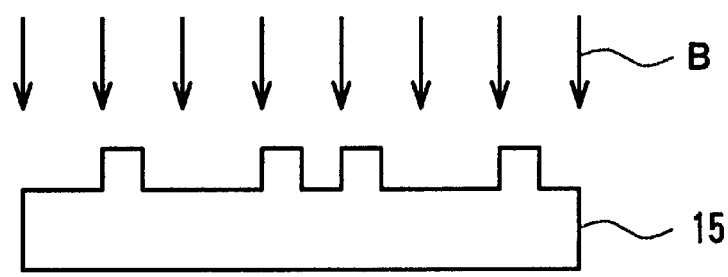

Step of FIG. 32D shows separation of the resist pattern 16a from the template 19. After post baking and the like to improve tolerability, FAB irradiation is performed as shown in step of FIG. 32D. FAB is an electrically neutral beam, and in particular, parallel plate type FAB has highly linear etching beam so that the imprint base 15 can be etched to a high aspect ratio.

By following above steps, the micro-patterncan be imprinted efficiently on the resist film 16, and the imprinted pattern 16a is used as etch-mask to perform etching of insulation films and conductive films on the wafer as well as the wafer itself. The method eliminates exposure apparatus, and equipment cost can be reduced significantly.

Figure 34:
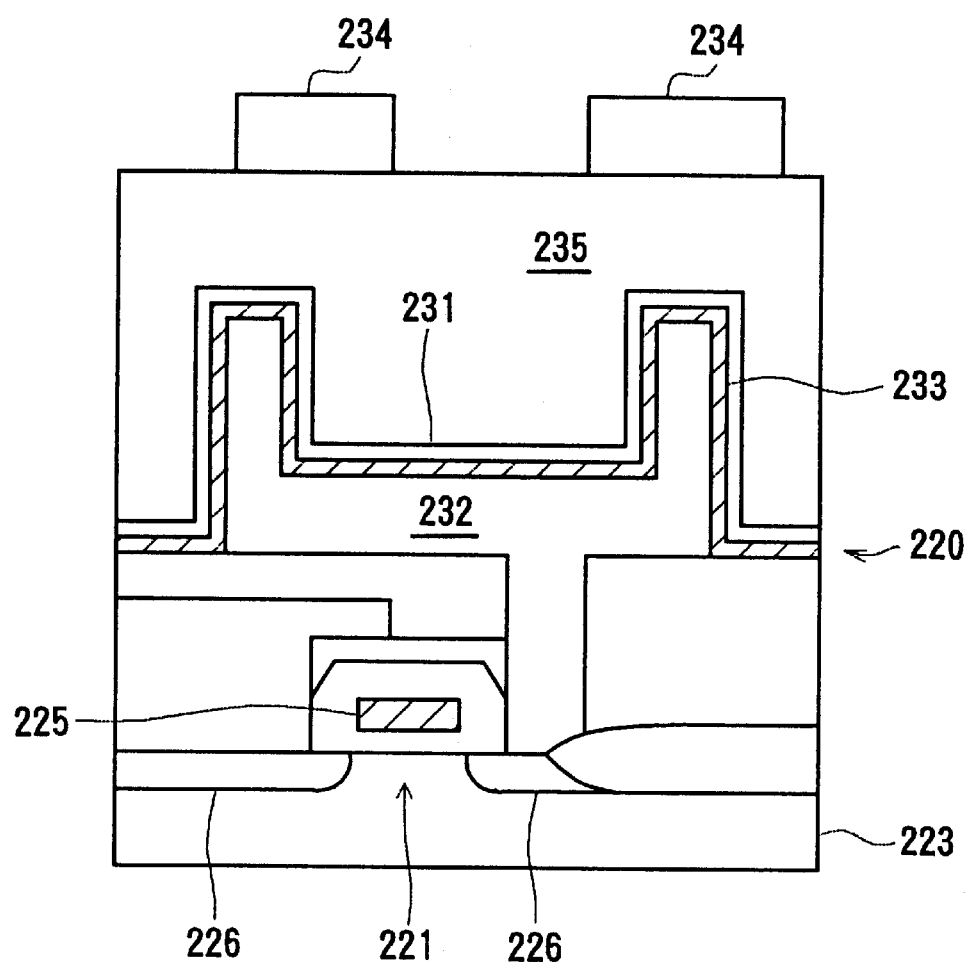
FIG. 34 is illustration of a variation of the DRAM shown in FIG. 35.
Figure 35A:
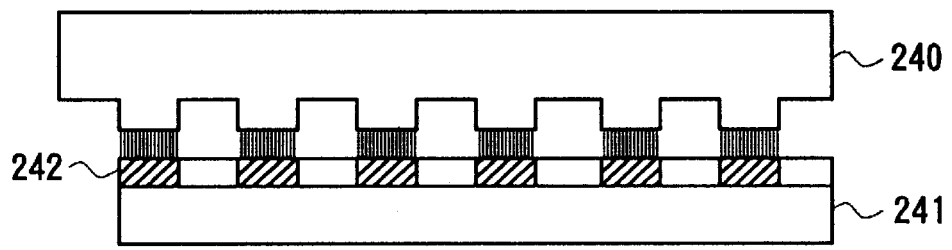
FIGS. 35A~35D are illustrations of the steps for a method of making a master disc for producing recorded medium used in optical disc apparatus.
Figure 35B:
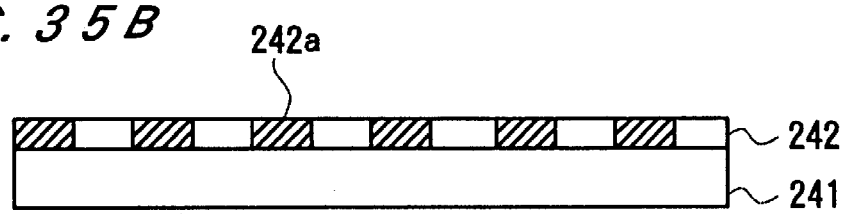
Figure 35C:
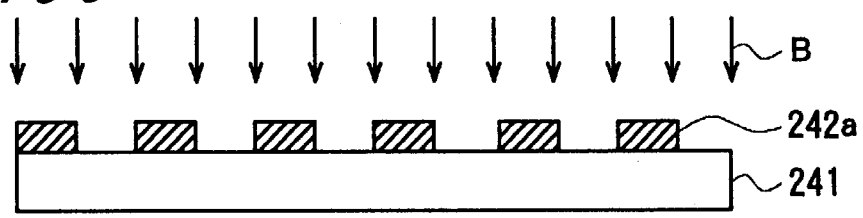
Figure 35D:
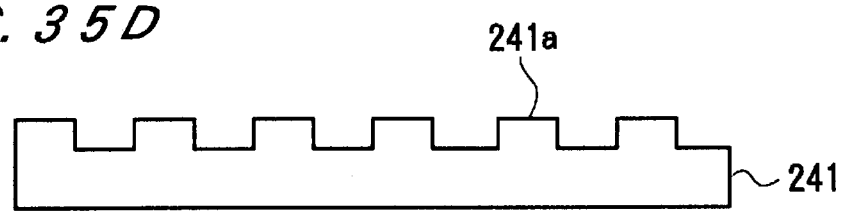

FIGS. 33 and 34 show examples of cross sectional cell structure of LSI, especially the DRAM structure. A capacitor section 220 is comprised by an oxide film 224 intervening between the silicon base 223 and the polysilicon film 222. A transistor section 221 is a MOSFET comprised by a gate electrode 225 of polysilicon operating through the thin oxide film 224, located between diffusion layers 226 for source/drain fabricated on silicon substrate 223. Wiring line 227 of metallic material such as Al contacts the n+diffusion layer 226 through a contact hole 228. In this type device structure, the need for size reduction is focused particularly on the width of gate electrode 224, the thickness of thick oxide layer 224 and the width of contact hole 228. It is preferable that the size of these regions should be less than the optical wave length limits at around less than 0.1 $\mu$m.

FIG. 34 shows a cell structure of another DRAM. In this structure, the capacitor section 220 has a vertical cell configuration disposed on top of the transistor section 221. The capacitor section 220 is comprised by an insulator film 233 sandwiched between the upper electrode 231 and the lower electrode 232. Structure of the transistor section 221 is the same as that shown in FIG. 33. In this device, word shunt lines 234 are placed on the insulation film 235.

The width of circuit patterns in LSI devices is becoming narrower every year, and the minimum line width in 1 Gbit memory will be about 0.2 $\mu$m and decreasing yet further. Along with the need for narrower line width, demand is towards a structure of higher aspects ratios as indicated in FIG. 34, and it is anticipated that, in the near future, aspect ratio higher than five will be demanded.

Fast atomic beam (FAB) is highly effective in etching fabricated structures having a high aspect ratio. Conventional plasma etching presents a problem of charge accumulation on the surface of the object being etched, and in some case, insulation film can be broken by charge accumulation. In particular, it is necessary to etch thin insulation film in memory devices, and if the insulation film is damaged by charge accumulation, leak current is increased and the memory device cannot work properly as its capacitance is degraded. The use of FAB, with its electrical neutrality and linear etching beam, promotes fabrication of circuit structures having a high aspect ratio, without the fear of causing charge accumulation. Therefore, by utilizing the technology of evanescent field assisted exposure or stamp imprinting technique for fabricating photo-resist film to produce etch-mask to be used in conjunction with FAB, it is considered possible to manufacture micro-patterns having high aspect ratios.

When such fabrication techniques become available, it would be possible to further increase circuit density in logic LSI by reducing width and line dimensions, thereby leading to faster processing speed. For memory devices, memory capacity per given area would increase dramatically to provide high performance memory devices. Processing capabilities of microprocessor chips, which consist of logic and memory circuits, would also benefit greatly from improvements in integration density.

Next, applications of the present technology to recording medium for magnetic-optical discs and head devices will be presented.

FIGS. 35A through 35D show an embodiment related to a method of making a master disc for producing recorded medium used in optical disc apparatus. In this case, it presupposes that an exposure-mask 240 having micro-patterns of sub-wavelength dimensions for use in proximity field exposure is already available. Such an exposure-mask 240 is installed in an exposure apparatus shown in FIG. 1, for example, and light is radiated from a light source. Master disc 241 may be made of a metallic material having a resist film 242 coated thereon. The resist film 242 is made to contact with or placed in proximity at a sub-wavelength distance to generate evanescent fields 243, and the resist film 242 forms exposed regions 242a, thereby imprinting the micro-pattern on the mask 240, as shown in step of FIG. 35B. Unexposed regions are removed by photolithographic developing and post baked to improve tolerability, and as shown in step of FIG. 35C, FAB irradiation is performed, with the use of etch-mask 242a, as explained earlier, to produce a master disc having a micro-pattern 241 imprinted thereon, as shown in step of FIG. 35D. FAB has high linearity of the etching beam and is comprised by electrically neutral particles so that structures having a high aspect ratio can be produced by FAB etching. This process produces recording signals (bits) on the surface of the master disc 241. Minimum size of the bit or track width is sub-wavelength at about 0.1 μm.

FIGS. 36A through 36E show an embodiment related to a method of making an optical recording medium.

Figure 36A:
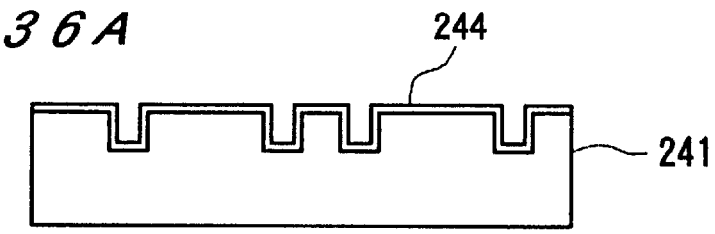
FIGS. 36A~36E are illustrations of the steps for a method of making an optical recording medium using an imprinting body.
Figure 36B:
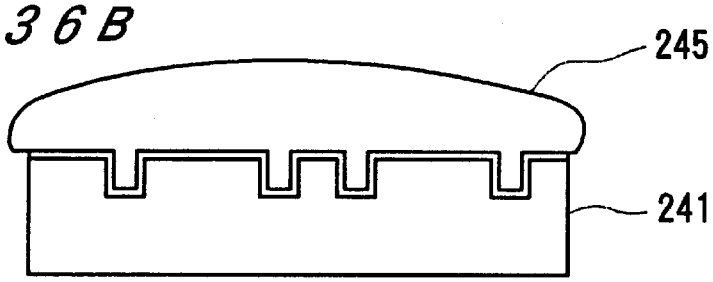
Figure 36C:
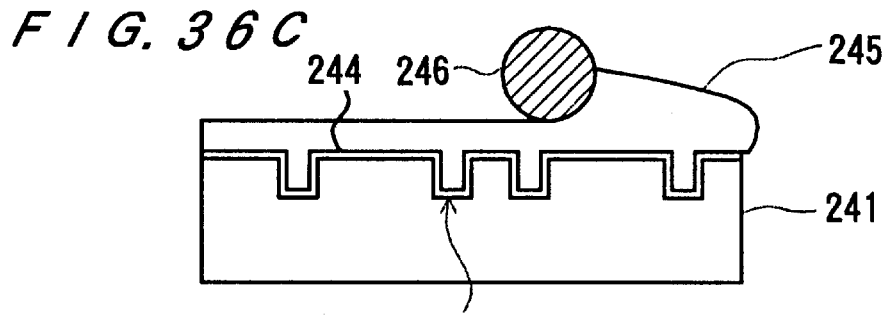

As shown in step of FIG. 36A, a master disc 241 produced by the above technique is placed so that the micro-pattern faces upwards, and is coated thinly with a water soluble thin film 244. Next, as shown in step of FIG. 36B, a thermoplastic masking material 245 is poured on top, and as shown in step of FIG. 36C, a roller 246 is used to push the masking material 245 so as to reach into every corners of the micro-pattern. Next, as shown in step of FIG. 36D, the disc 241 is immersed in water 248 to dissolve the film 244, which is removed from the disc 241. As shown in step of FIG. 36E, an optical disc 245a having recording signals of sub-wavelength dimensions is completed using this process, optical discs having recording signals of sub-wavelength dimensions can be easily produced in large quantity from the master disc.

Figure 36D:
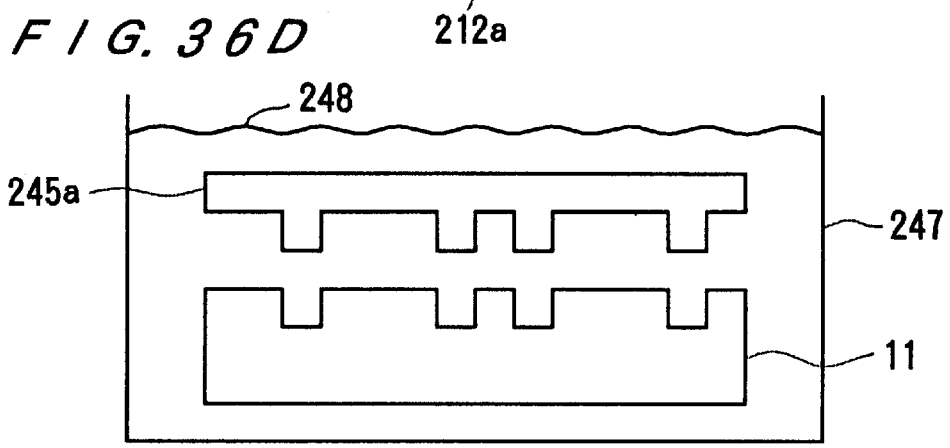
Figure 36E:
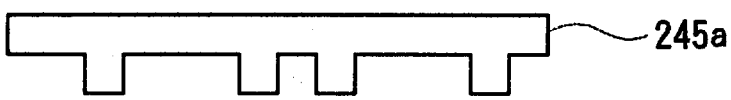

A thin separation layer may be produced in step of FIG. 36A of the above process, and dissolved in water instep of FIG. 36D to facilitate separation from the mold and reduce chances of damaging the micro-pattern. However, if mold separation does not pose a problem, steps of FIG. 36A and FIG. 36D may be omitted. Instead of using a roller to press on the thermoplastic material, injection molding process may be used to produce recorded discs.

Also, the example was based on the evanescent-field-assisted imprinting technique to manufacture a master disc, but electron beam or X-ray lithographic techniques may be used in combination with FAB irradiation to produce signal patterns of sub-wavelength size.

Figure 37:
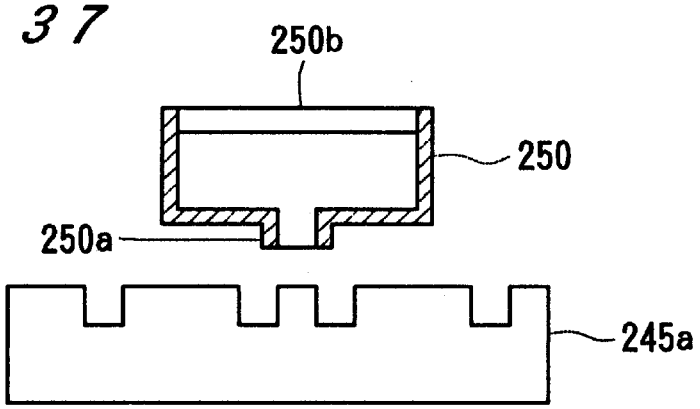
FIG. 37 is schematic diagram of a reading head in an optical disc apparatus in the embodiment.
Figure 38:
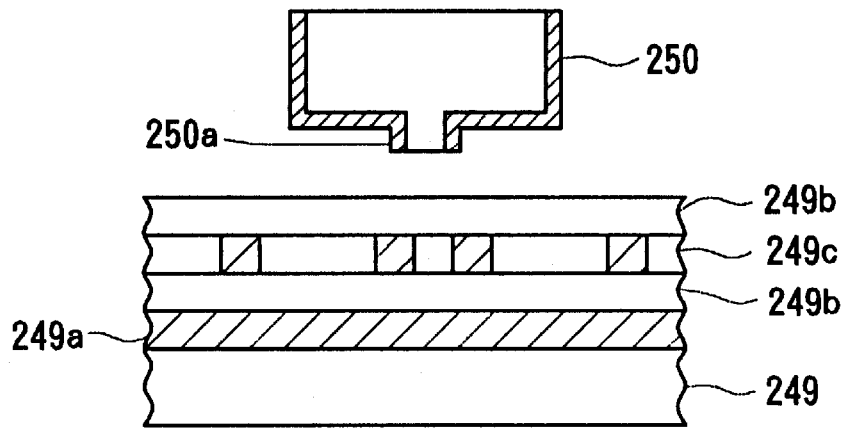
FIG. 38 is a schematic diagram of a variation of the reading head in FIG. 37.

It is preferable that a light detector 250b for use with such an optical disc to be provided with a reading head shown in FIG. 37 so that the tip 250a of the head 250 is a sub-wavelength dimensions. This device permits to detect recorded information represented by bit patterns of sub-wavelength size on the optical disc 245a through an evanescent field. Also, as shown in FIG. 38, recorded patterns are not limited to pit patterns produced on the recording medium, instead of the pits, signals may be represented by phase changes, brought about by light radiation, that are recorded on a phase change layer 249c provided on a base 249. Such a recording medium is comprised by a phase change layer containing primarily Ge-Te-Sb sandwiched between a metallic reflection film 249a and a transparent protection film 249b formed on the base 249. Signals are recorded according to transmission/reflection of incident light through the phase change layer 249c.

Such a head 250 having a micro-opening is produced by electron beam to scribe a pattern of sub-wavelength dimensions directly on a photo-resist film coated on a substrate such as quartz glass or resin, and using the pattern as the etch-mask for FAB etching to produce a deep cavity.

Figure 39:
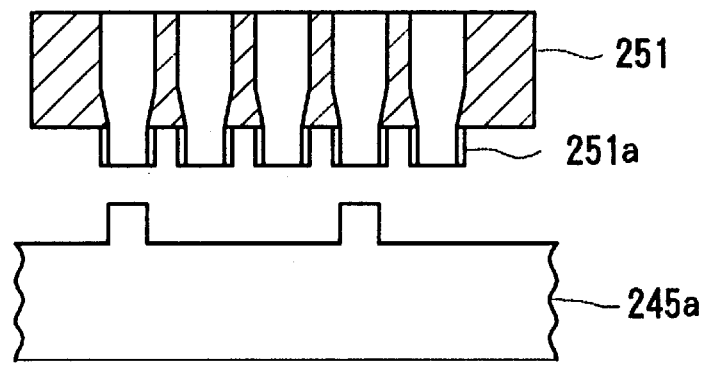
FIG. 39 is a schematic diagram of another variation of the reading head in FIG. 37.

FIG. 39 shows a multi-track reading head 251 made by arranging a plurality of small heads 251a in a line that can respond to evanescent-field-assisted light transmission. Therefore, such a multiple-head is able to read several tracks, containing recorded bit signals of several tens of nanometers size, concurrently.

Figure 40:
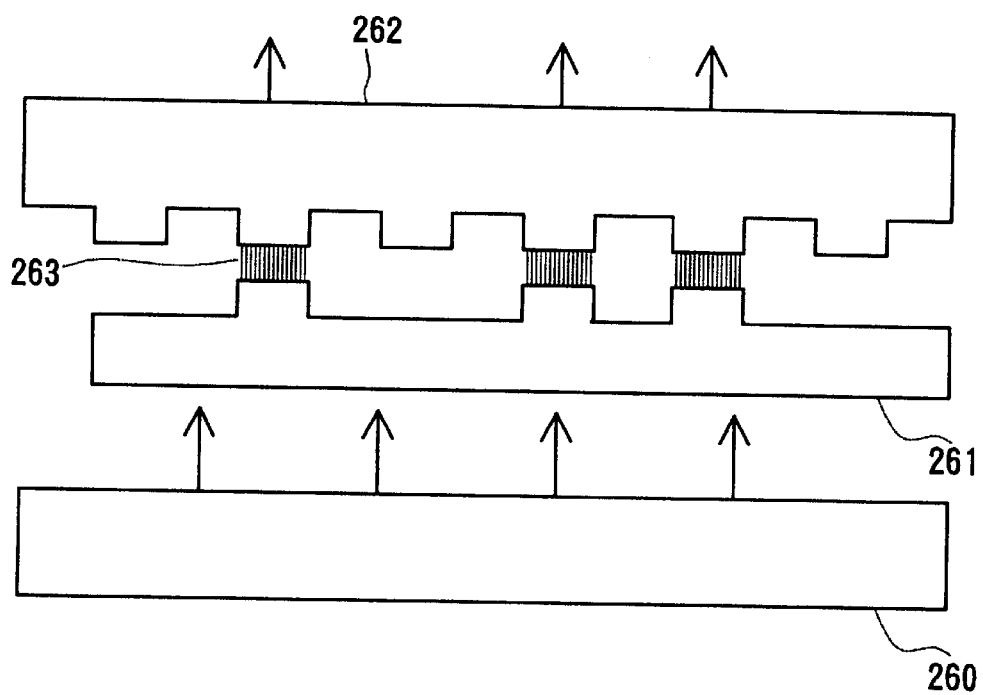
FIG. 40 is schematic diagram of an optical recording device in an embodiment.

FIG. 40 shows an optical recording device comprised by a recording base 261 containing a pattern of sub-wavelength dimensions to respond to light transmission and reflection, a light source 260 for incident light and a sensor section 262 placed in opposition to the pattern surface. There corded medium 261 has recorded information comprised by micro-patterns of 50~100 nm width and 10~30 nm height. The base 262 of the sensor section has similar continuous micro-patterns and the high structures of the pattern is in contact with or placed in proximity at a sub-wavelength distance.

On the recording base 261, data are represented by "1" or "0" corresponding to presence/absence of high structures of a high/low structure, but in contrast, data in the detection section are represented by a continuously imprinted high/low structure of the micro-patterns. Therefore, the recording section records "1" where its high structure coincides with a high structure in the sensor section, and records "0" where there are no opposing high structures. Those points with "1" signals can produce evanescent-field-assisted transmission signals which are detected through the sensor section 262 in the detection section (not shown). The detection section may be connected to a fiber bundle of sharp tipped fibers of sub-wavelength dimensions to receive evanescent-field-assisted signals.

In such a recording device, the sensor section 262 and the recording section 261 are fixed in their relation positions, and has no moving parts. Therefore, this device can conveniently detect signal strengths produced by micro-patterns of sub-wavelength dimensions, and can realize a stationary-type of information reproduction device of ultra-high data capacity.

Also in the device showing in FIG. 40, light is input from the back surface of the base of the recording section, and the sensor section outputs signals from its back surface, but the device may be arranged such that signals are input from the back surface of the sensor section to the recording section, and reflected output signals are detected by the sensor section. Further, a reflection film may be coated on the back surface of the base of the recording section. Such a device can generate higher contrast signals from weak signals transmitted through the evanescent fields.

Devices used to record/regenerate strength variation of optical signals in compact disc (CD), laser disc (laser disc), digital video disc (DVD) operate according to pit patterns provided in the recording section to generate variations in signal strength. In DVD, blue laser (emitting at 458nm) and krypton ion laser (emitting at 351 nm) are used to fabricate minimum pit dimensions of a 0.4 μm length and a 0.3 μm bit width, and signal strength variations are monitored by detection section based on laser and lens system. Conventionally, the disc having recorded data is rotated by one signal detection section to serially read the presence/absence of pits.

Master disc for reproducing recorded medium are manufactured by photolithography. In the conventional technology, female-type master disc is produced by laser exposure technique to generate pit patterns, and the cavities are treated with Ni plating and electro-forming. Consumer discs for CD, LD, DVD are produced from the master disc by injection molding.

In magnetic-optic recording devices, data recording and erasing are performed by heating above the Curie point to randomize electron spins in the magnetic material and cooling in a magnetic field to align spins in the magnetic material. Heating temperature can exceed 400° C. locally. Reproduction is performed by detecting rotated polarized light components, produced by optical magnetic interaction (Kerr Faraday effect) in the recorded magnetic layer. Therefore, a polarized light detector is used in the reflected laser detection section of the head.

FIG. 41 shows a structure of the head section of a magnetiv-optical disc device. The head 266 has a tip opening 267 of a sub-wavelength dimensions, and also has a magnetic field generation coil 268 for generating a magnetic field for magnetizing a magnetic layer 269*a* of a recording medium 269, which is placed in proximity of the tip opening 267. Magnetization axes generated in the magnetic layer 269*a* are controlled over a region of sub-wavelength dimensions by controlling the interaction of the evanescent field 263 and the magnetic layer 269*a* by the light input through the tip opening 267. Conversely, recorded data are read by detecting power of input light affected by the differences in the magnetization axes.

The recording medium is comprised by a base 269 and a magnetic layer 269*a* formed thereon and a protective film 270. The protective film has micro-roughness to provide a friction reducing effect when the disc is placed at less than 50 nm distance to the head.

The magnetic layer 269*a* may be impressed with digitized signals so that one pit corresponds to one bit to provide higher contrast images.

Although certain preferred embodiments of the present invention have been shown and described in detail, it should be understood that various changes and modifications may be made therein without departing from the scope of the appended claims.

What is claimed is:

1. An optical imprinting apparatus comprising:

a container in which light is enclosed therein;

an exposure-mask having a proximity field exposure pattern fixed to a section of said container for exposing said exposure pattern on a photo-sensitive material through an evanescent field by said light enclosed therein; and a light source for supplying said light in said container;

wherein said container comprises a waveguide.

2. An optical imprinting apparatus according to claim 1, wherein said exposure-mask is provided integrally with said container.

3. An optical imprinting apparatus according to claim 1, wherein said exposure-mask is detachably attached to said container.

4. An optical imprinting apparatus according to claim 1, wherein said light source is connected to an input surface of said waveguide.

5. An optical imprinting apparatus according to claim 1, wherein said light source is disposed outside of said waveguide for injecting a light into said waveguide.

6. An optical imprinting apparatus comprising:

a container in which light is enclosed therein;

an exposure-mask having a proximity field exposure pattern fixed to a section of said container for exposing said exposure pattern on a photo-sensitive material through an evanescent field by said light enclosed therein; and a light source for supplying said light in said container;

wherein said light source is disposed inside of said container.

7. An optical imprinting apparatus according to claim 6, wherein said exposure-mask is provided integrally with said container having said light source therein.

8. An optical imprinting apparatus according to claim 6, wherein said exposure-mask is detachably attached to said container.

9. An optical imprinting apparatus according to claim 6, wherein said light source has a lamp array.

10. An optical imprinting apparatus according to claim 6, wherein said light source has a light-emitting gas sealed in said container.

* * * * *